(12) United States Patent
Ozbas et al.

(10) Patent No.: US 11,592,933 B1
(45) Date of Patent: Feb. 28, 2023

(54) DISPLAYS WITH INTEGRATED TOUCH SCREENS

(71) Applicant: X Display Company Technology Limited, Dublin (IE)

(72) Inventors: Murat Ozbas, Penfield, NY (US); Ronald S. Cok, Rochester, NY (US)

(73) Assignee: X Display Company Technology Limited, Dublin (IE)

( * ) Notice: Subject to any disclaimer, the term of this patent is extended or adjusted under 35 U.S.C. 154(b) by 0 days.

(21) Appl. No.: 17/570,985

(22) Filed: Jan. 7, 2022

(51) Int. Cl.
*G06F 3/041* (2006.01)
*G06F 3/044* (2006.01)

(52) U.S. Cl.
CPC ........ *G06F 3/04166* (2019.05); *G06F 3/0412* (2013.01); *G06F 3/0446* (2019.05)

(58) Field of Classification Search
None
See application file for complete search history.

(56) References Cited

U.S. PATENT DOCUMENTS

| | | | |
|---|---|---|---|
| 7,622,367 B1 | 11/2009 | Nuzzo et al. | |
| 8,222,458 B2 | 7/2012 | Khachik et al. | |
| 8,243,027 B2 | 8/2012 | Hotelling et al. | |
| 8,506,867 B2 | 8/2013 | Menard | |
| 9,520,537 B2 | 12/2016 | Bower et al. | |
| 9,799,719 B2 | 10/2017 | Cok | |
| 9,991,163 B2 | 6/2018 | Bower et al. | |
| 10,170,535 B2 | 1/2019 | Cok | |
| 10,262,567 B2 | 4/2019 | Cok et al. | |
| 10,289,252 B2 | 5/2019 | Cok | |
| 2010/0214247 A1 | 8/2010 | Tang et al. | |
| 2016/0093600 A1 | 3/2016 | Bower et al. | |
| 2019/0012957 A1* | 1/2019 | Liu | G06F 1/1643 |
| 2019/0333901 A1* | 10/2019 | Cok | H01L 23/5386 |
| 2021/0081076 A1* | 3/2021 | McCulloch | H03K 17/9622 |
| 2021/0152244 A1* | 5/2021 | Pezeshki | H01L 33/32 |

* cited by examiner

*Primary Examiner* — Robin J Mishler
(74) *Attorney, Agent, or Firm* — Choate, Hall & Stewart LLP; Michael D. Schmitt

(57) ABSTRACT

A display with integrated touch screen includes pixels distributed in an array of rows or pixels connected by row wires and columns of pixels connected by column wires defining a display area on a display substrate. The pixels can comprise mutually exclusive subarrays of pixels forming clusters. Each cluster can be independently controlled and can comprise a touch controller for sensing touches. Each pixel can include one or more micro-iLEDs. A first row wire can be driven with a display signal at the same time the touch controller senses one or more second row wires different from the first row wire. The touch controller can sense multiple row wires at a time or can receive a control signal at a frequency of no less than one MHz on a row wire. In some embodiments, the touch controller comprises a capacitance circuit in an integrated circuit separate from the display substrate.

20 Claims, 19 Drawing Sheets

DISPLAYS WITH INTEGRATED TOUCH SCREENS

FIELD

The present disclosure relates to flat-panel display architectures having integrated touch sensing elements disposed within the display area.

BACKGROUND

Flat-panel displays are widely used in conjunction with computing devices, in portable devices, and for entertainment devices such as televisions. Such displays typically employ a plurality of pixels distributed over a display substrate to display images, graphics, or text. In a color display, each pixel includes light emitters that emit light of different colors, such as red, green, and blue. For example, liquid crystal displays (LCDs) employ liquid crystals to block or transmit light from a backlight behind the liquid crystals and organic light-emitting diode (OLED) displays rely on passing current through a layer of organic material that glows in response to the current.

Many display systems, particularly for displays used in mobile applications such as tablet computers and smartphones, include a touchscreen that responds to commands provided by touching the touchscreen with a finger or stylus. A variety of touchscreen technologies are known, for example resistive, optical, acoustic, inductive, and capacitive.

Touchscreens are typically located over a display and use separate substrates and covers. Such an arrangement adds thickness and weight to a display system and absorbs light emitted by the display. In recent years, touchscreen components have been formed on display components, for example display covers, reducing the thickness and weight of the display system. For example, U.S. Pat. No. 8,243,027 describes a variety of touchscreen structures in a liquid crystal display having a backlight and color filters. U.S. Patent Application Publication No. 2010/0214247 discloses an array of touch elements including first and second electrodes forming a plurality of two-dimensionally arranged capacitive sensing units in a layer.

In general, touch screens are either single-touch or multi-touch. Single-touch systems can detect only one touch at a time, for example most resistive touchscreens are of this type. Such screens are typically simple, fast, robust, easy to use with a variety of implements, and inexpensive to control and operate. In contrast, multi-touch touchscreens, for example self-capacitive or mutual-capacitive touch sensors, can detect multiple touch points on a screen at a time but are more limited in their touch modalities, for example limited to touches with a conductive stylus, such as a human finger. Such multi-touch systems use a matrix of touch sensors and are typically controlled using a sequential matrix scanning technique. For example, a mutual-capacitance touch system includes orthogonal arrays of horizontal and vertical overlapping electrodes. At every location where the horizontal and vertical electrodes overlap, a capacitor is formed, providing a capacitive touch sensor. A touch controller drives a row of touch sensors at a time and then reads a sense signal from each of the columns. Thus, only one row of sensors can be activated and read at a time. The touch controller sequentially drives successive rows to read back a signal from each touch sensor in the array. Because the rows of touch sensors are sequentially activated, as the touch sensor array grows larger and includes more rows, the rate at which the touch sensor array can be controlled decreases. This limits either the size (number of touch sensors in the touchscreen) or the scan rate at which touches can be detected, or both. Furthermore, touches in different rows are detected at different times. Such a control scheme is similar to the passive-matrix control used in small displays, for example small LCDs or OLED displays.

There remains a need, therefore, for touchscreen structures that provide improved functionality, multi-touch capability, and increased size and scan rates.

SUMMARY

Embodiments of the present disclosure provide a micro-inorganic-light-emitting-diode control circuit comprising a micro-inorganic-light-emitting-diode (micro-iLED) comprising one or more inorganic material layers that emit light when electrical current passes through the one or more inorganic layers, an anode disposed in electrical contact with the one or more inorganic material layers, and a cathode disposed in electrical contact with the one or more inorganic material layers so that current passing from the anode to the cathode through the one or more inorganic material layers causes the micro-iLED to emit light. An anode conductor can be connected directly to the anode that provides electrical current to the micro-iLED and a cathode conductor can be connected directly to the cathode that receives electrical current from the micro-iLED. The anode conductor or the cathode conductor is a signal conductor. A signal circuit can be connected to the signal conductor operable to provide or receive a control signal at a frequency of no less than one MHz on the signal conductor.

In some embodiments, the micro-iLED has a capacitance of no greater than 1 nanofarad. In some embodiments, the signal circuit comprises a signal-extraction circuit operable to extract the control signal from the signal conductor. In some embodiments, the signal circuit comprises a micro-iLED controller or a micro-iLED controller comprises the signal circuit. In some embodiments, the signal circuit comprises a cluster controller or a cluster controller comprises the signal circuit. In some embodiments, the signal circuit is operable to provide, send, transmit, or receive a touch sense control signal or a touch sense response signal on the signal conductor at a frequency of no less than one MHz.

According to embodiments of the present disclosure, the signal circuit is a capacitive touch controller. The anode conductor, the cathode conductor, or both can be or comprise electrodes in capacitive touch conductors, e.g., self-capacitance, absolute-capacitance, or mutual-capacitive touch conductors. According to embodiments of the present disclosure, the anode conductor is a power plane or the cathode conductor is a ground plane.

According to embodiments of the present disclosure, the micro-iLED comprises a broken, separated, or fractured micro-iLED tether, the signal circuit comprises a broken, separated, or fractured signal-circuit tether, or both.

According to embodiments of the present disclosure, a display comprises an array of pixels disposed in pixel rows and pixel columns. The array of pixels can be divided into mutually exclusive pixel subsets. Each of the pixel subsets can be a pixel cluster and each pixel in the pixel cluster can comprise a micro-inorganic-light-emitting-diode control circuit that can comprise at least a micro-iLED, anode conductor, cathode conductor, and signal conductor. For each of the pixel rows, the anode conductor of the micro-inorganic-light-emitting-diode control circuits in the pixel row can be commonly connected and, for each of the pixel columns, the cathode conductor of the micro-inorganic-light-emitting-diode control circuits in the pixel column can be commonly connected. For each of the pixel clusters, the signal circuit of the micro-inorganic-light-emitting-diode control circuit of each of the pixels in the pixel cluster is a single common signal circuit for the pixel cluster and can be connected to the signal conductor. The signal circuit can be operable to receive a control signal at a frequency of no less than one MHz on the signal conductor. The micro-iLED of the micro-inorganic-light-emitting-diode control circuit of each of the pixels can have a capacitance of no greater than 1 nanofarad. The signal circuit can comprise a signal-extraction circuit operable to extract the control signal from the signal conductor. The signal circuit can comprise a micro-iLED controller or a micro-iLED controller comprises the signal circuit. The signal circuit can comprise a cluster controller or a cluster controller comprises the signal circuit. In some embodiments, the signal circuit can be operable to provide, send, transmit, or receive a touch sense control signal or a touch sense response signal on the signal conductor at a frequency of no less than one MHz. The signal circuit can be a capacitive touch controller. The anode conductor, the cathode conductor, or both, can be capacitive touch conductors. The anode conductor can be a power plane or the cathode conductor can be a ground plane.

In some embodiments, the micro-iLED comprises a broken, separated or fractured micro-iLED tether, the signal circuit comprises a broken, separated or fractured signal-circuit tether, or both.

According to embodiments of the present disclosure, a pixel control circuit comprises an array of pixels disposed in pixel rows and pixel columns and a controller electrically connected to the pixels in the pixel rows with row wires and electrically connected to the pixels in the pixel columns with column wires. The controller can comprise a display control circuit operable to drive a first row wire or first column wire with a display signal and a touch controller operable to drive or receive a touch sense signal on a second row wire of the row wires different from the first row wire or a second column wire of the column wires different from the first column wire of the column wires at a same time.

In some embodiments, the display control signal is a row-select signal or a column-data signal. The display control circuit can be operable to drive each of the row wires in sequence as a first row wire with the display control signal.

The touch controller can be operable to drive each of the row wires in sequence as a second row wire or each of the column wires in sequence as a second column wire with the touch sense signal. The touch controller can be operable to drive or receive the touch sense signal on two or more second row wires different from the first row wire or two or more second column wires different from the first column wire with the sense signal at the same time. The touch controller can be operable to drive or receive the touch sense signal on two or more second row wires with the same sense signal at the same time or receives a sense signal on two or more second row wires at the same time. The touch controller can be operable to drive or receive the touch sense signal on all of the second row wires or all of the second column wires with a touch sense signal at the same time. Each of the row wires can be driven with a row-select signal or each of the column wires can be driven with a column-data signal.

In some embodiments, the touch sense signal is a touch sense control signal and the touch controller is responsive to the second row wire or the second column wire and is operable to receive a responsive touch sense response signal. The controller can be a cluster controller, the row wires can be cluster row wires, and the column wires can be cluster column wires.

According to some embodiments of the present disclosure, the controller is a cluster controller and the array of pixels and the cluster controller forms a pixel cluster. The pixel control circuit can comprise one or more additional pixel clusters, each of the one or more additional pixel clusters comprising an array of pixels disposed in rows and columns and a cluster controller electrically connected to the rows of pixels in the array of pixels with row wires and electrically connected to the columns of pixels in the array of pixels with column wires. The cluster controller can comprise a drive control circuit operable to drive a first row wire of the row wires or column wire of the column wires in the array of pixels with a display signal and a touch control circuit operable to drive a second row wire in the array of pixels different from the first row wire or a second column wire different from the first column wire with a touch sense signal at the same time. Each pixel of the array of pixels can comprise one or more micro-iLEDs.

According to embodiments of the present disclosure, a touch-screen control system comprises a display substrate, an array of micro-iLEDs disposed in pixel rows and pixel columns on the display substrate in a display area, a touch controller comprising a touch-controller substrate separate, individual, independent, and different from the display substrate, the touch-controller substrate disposed on the display substrate within the display area, a touch control circuit disposed in or on the touch controller substrate; and a capacitor conductor disposed in or on the touch controller substrate electrically connected to the touch control circuit. The touch-controller substrate can comprise a semiconductor substrate and the display substrate can be a dielectric substrate.

Some embodiments comprise a plurality of touch controllers disposed on the display substrate, each comprising a touch-controller substrate distinct from the display substrate. The touch controllers of the plurality of touch controllers can be arranged in a regular array on the display substrate. The micro-iLEDs in the array of micro-iLEDs can be arranged in mutually exclusive pixel clusters, each of the pixel clusters can comprise a touch controller of the plurality of touch controllers. Some embodiments comprise a cluster controller for each of the pixel clusters operable to control the micro-iLEDs in each cluster.

In some embodiments, the touch controller and the cluster controller are disposed in a common integrated circuit separate, individual, independent, and different from the display substrate.

In some embodiments, the capacitor conductor forms a self-capacitance touch detector. In some embodiments, the capacitor conductor is a capacitor wire disposed around a perimeter of the touch-controller substrate or touch control circuit or both. In some embodiments, the capacitor conductor is electrically connected to a power signal, a ground signal, a power plane, or a ground plane. In some embodiments, the capacitor conductor is a first capacitor conductor and the touch-screen control system comprises a second capacitor conductor forming a mutual-capacitance capacitor with the first capacitor conductor. The first capacitor conductor can be a first capacitor wire and the second capacitor conductor can be a second capacitor wire disposed around a perimeter of the touch-controller substrate or touch control circuit or both forming a mutual-capacitance capacitor with the first capacitor wire. The first capacitor conductor or the second capacitor conductor can be electrically connected to a power wire, a power plane, a ground wire, or a ground plane. The first capacitor wire and the second capacitor wire can be interdigitated.

According to embodiments of the present disclosure, a display with integrated touch sensing comprises an array of pixels disposed in pixel rows and pixel columns and a touch controller electrically connected to the pixel rows with row wires and electrically connected to the pixel columns with column wires. The touch controller can be operable to drive a touch sense control signal onto or to receive a touch sense response signal from two or more row wires, two or more column wires, or both, at a same time. The touch controller can be operable to drive a touch sense control signal onto or to receive a touch sense response signal from two or more row wires, two or more column wires, or both at a same time.

According to embodiments of the present disclosure, a display with integrated touch sensing comprises a plurality of pixel clusters. Each of the pixel clusters comprises an array of pixels disposed in cluster rows and cluster columns and a cluster controller electrically connected to the cluster rows of pixels with cluster row wires and electrically connected to the cluster columns of pixels with cluster column wires. Each cluster controller in a pixel cluster can be operable to sense touches in the array of pixels in the pixel cluster. The cluster controller can comprise a display control circuit operable to drive a first row wire or first column wire with a display signal and a touch controller operable to drive a second row wire different from the first row wire or a second column wire different from the first column wire with a touch sense signal at a same time. Each cluster controller can be operable to provide a display control signal to cluster rows or cluster columns of pixels during a frame period and can be operable to sense the cluster row wires, the cluster column wires, or both during a blanking period to receive a touch sense signal. The cluster controller can comprise a display control circuit operable to separately and individually drive each of the row wires or each of the column wires sequentially with a display signal and a touch controller can be operable to drive two or more of the cluster row wires or two or more of the cluster column wires in common with a common touch sense signal at a same time. Each of the cluster row wires or each of the cluster column wires in each of the pixel clusters can form a capacitor with a power line, power plane, ground line, or ground plane.

Embodiments of the present disclosure provide integrated touch-sensing functions in a flat-panel display with reduced size and improved performance.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which.

Figure 1:
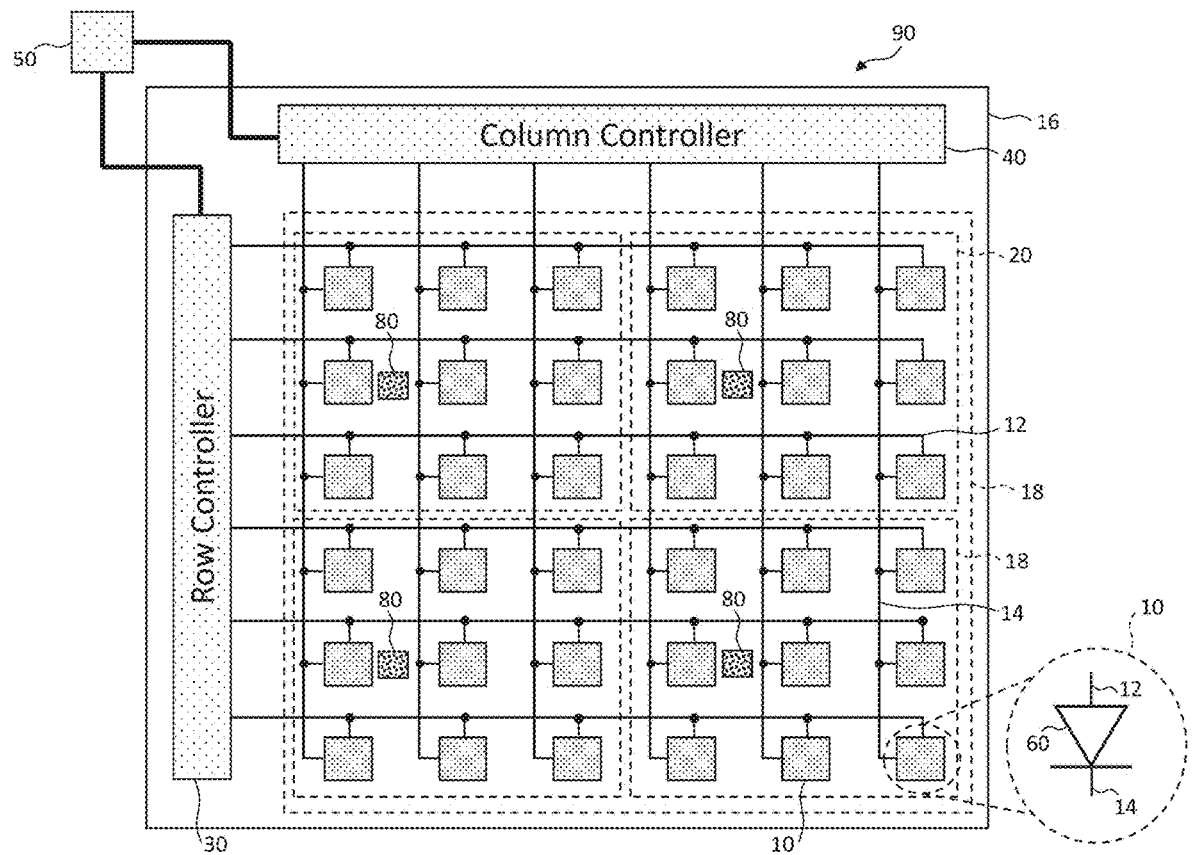
FIG. 1 is a schematic of a display with pixel clusters and touch controllers according to illustrative embodiments of the present disclosure.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or

DETAILED DESCRIPTION OF CERTAIN EMBODIMENTS

Embodiments of the present disclosure provide touch-sensing circuits integrated on a display substrate in a display area of a display, for example a flat-panel display. Embodiments can provide displays with fewer layers and improved clarity, touch sensing, sense rate, and responsiveness.

Figure 2:
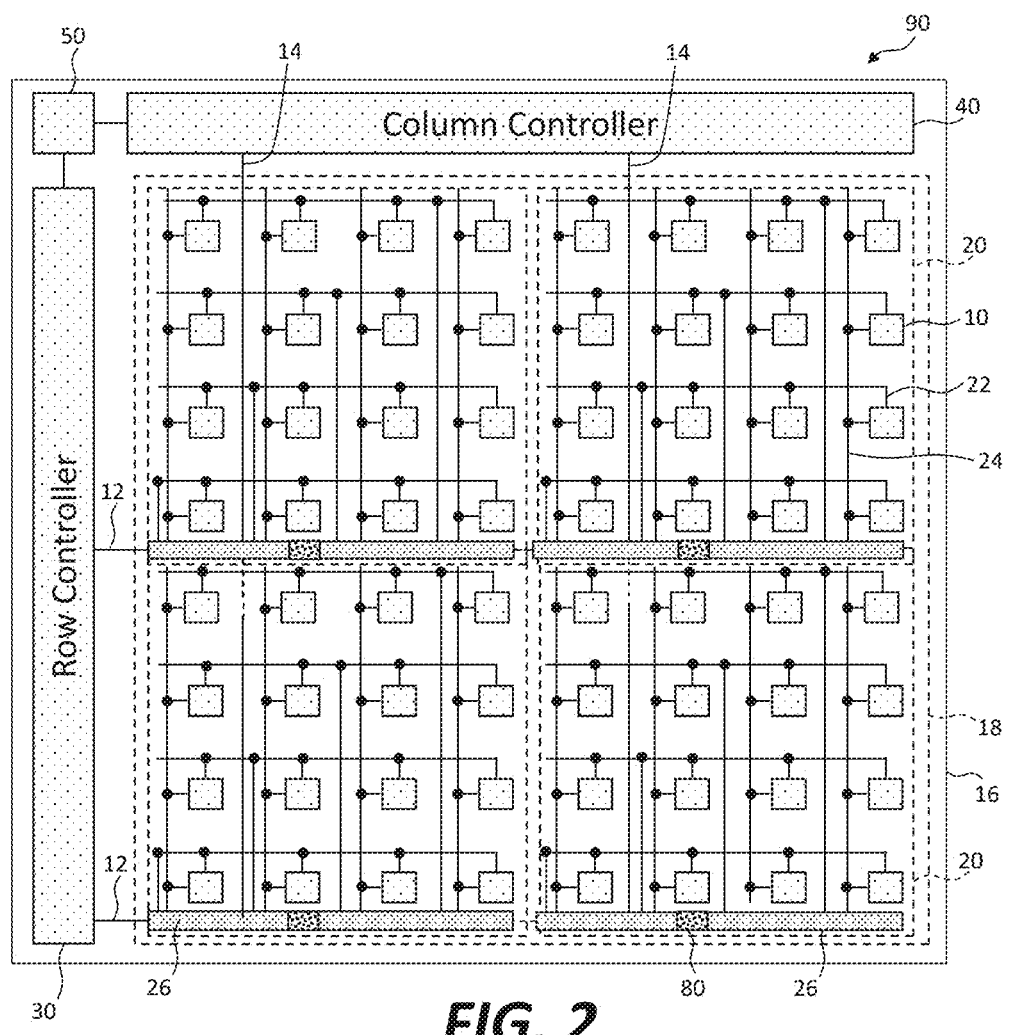
FIG. 2 is a schematic of a display with pixel clusters and pixel cluster controllers according to illustrative embodiments of the present disclosure.
Figure 3A:
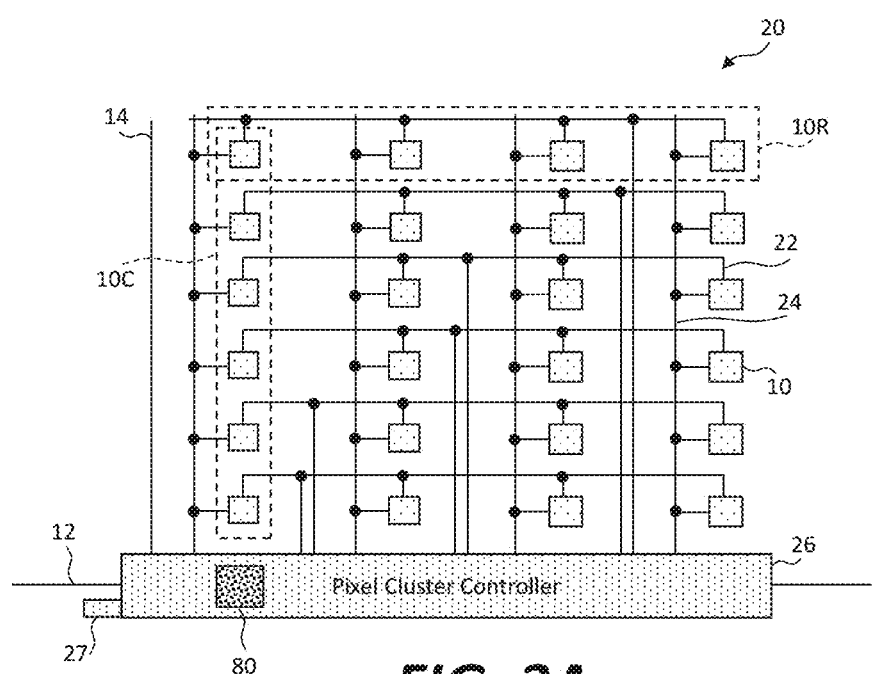
FIG. 3A is a schematic of a pixel cluster with a pixel cluster controller integrated with a touch controller according to illustrative embodiments of the present disclosure.
Figure 3B:
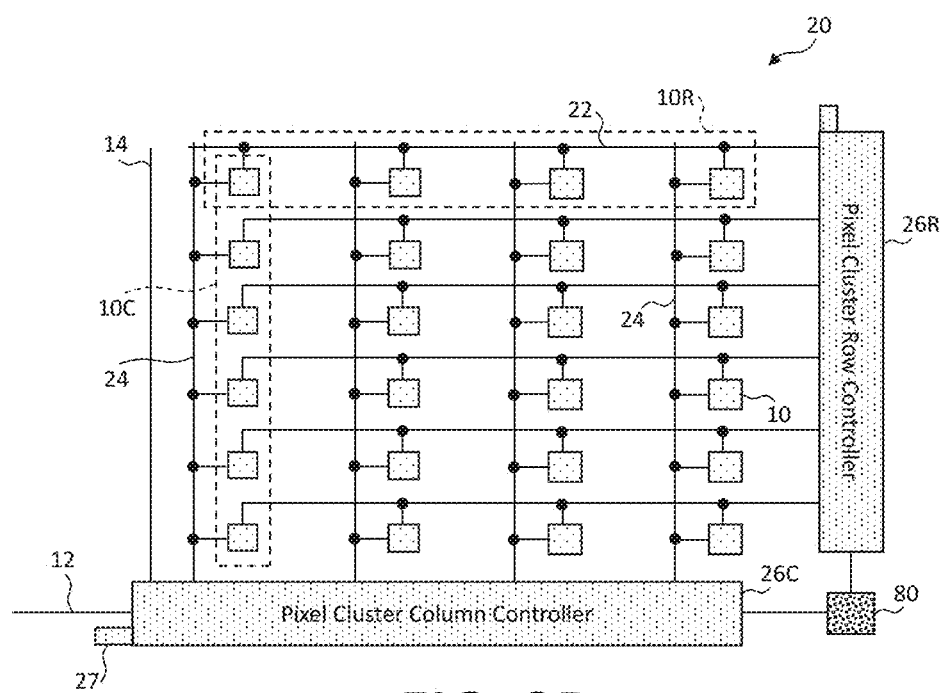
FIG. 3B is a schematic of a pixel cluster with a cluster controller and a separate touch controller according to illustrative embodiments of the present disclosure.

Embodiments of the present disclosure and as illustrated in FIGS. 1-3B can comprise a flat-panel display 90 with an array of pixels 10 disposed on a display substrate 16. Pixels 10 can be arranged in pixel rows 10R and pixel columns 10C (e.g., as shown in FIGS. 3A and 3B). Pixel rows 10R of pixels 10 can be connected (e.g., electrically connected) with row wires 12 and pixel columns 10C of pixels 10 are connected (e.g., electrically connected) with column wires 14 disposed on display substrate 16. A row controller 30 can transmit row-control signals, e.g., row-select signals, on row wires 12 and a column controller 40 can transmit column-control signals, e.g., column-data signals, on column wires 14. Display controller 50 can provide control and data signals to row controller 30 and column controller 40 through one or more electrical connections, e.g., a bus comprising one or more wires. Row controller 30 and column controller 40 can control the array of pixels 10 with either passive-matrix or active-matrix control and data signals. Touch controllers 80 for sensing touches can be disposed in an array over display substrate 16, for example one touch controller 80 in each pixel cluster 20.

Display substrate 16 can be any useful substrate, for example a dielectric substrate comprising glass or polymer, for example as are found in the flat-panel display industry. In some embodiments, display substrate 16 is a semiconductor substrate (e.g., a wafer), such as in found in the integrated circuit industry. Row wires 12 and column wires 14 can be photolithographically defined metal wires that transmit power, ground, row-select, or column-data signals from row controller 30 or column controller 40 to pixel rows 10R or pixel columns 10C of pixels 10, respectively. Row controller 30 and column controller 40 can be integrated circuits disposed on display substrate 16 in one or more packages or as bare die(s) or formed on or in and native to display substrate 16. In some embodiments, row controller 30 or column controller 40 are not disposed on display substrate 16 but are external to display substrate 16 and are connected to row wires 12 or column wires 14 through cables or other electrical connectors.

Each pixel 10 can comprise a micro-inorganic-light-emitting diode (micro-iLED) 60, for example having a length or width no greater than 100 microns and a thickness no greater than 20 microns. In some embodiments, each pixel comprises two or more, e.g., three, micro-iLEDs 60 that each emit a different color of light, for example, red, green, and blue light, when provided with electrical current at a suitable voltage. Each micro-iLED 60 can be connected with separate row wires 12 and separate column wires 14 to individually control each micro-iLED 60 in a pixel 10. FIG. 1 illustrates only a single row wire 12, single column wire 14, and single micro-iLED 60 in a pixel 10, but some embodiments of the present disclosure include pixels 10 that each comprise multiple micro-iLEDs 60 connected with multiple row wires 12 or column wires 14. In some embodiments, each pixel 10 comprises multiple micro-iLEDs 60 that are connected in common with a row wire 12, e.g., to communicate a common row-select signal but different column wires 14 to communicate different image data (e.g., red, green, and blue image pixel data). Row wires 12 or column wires 14 can electrically connect to anode and cathode electrical contacts of micro-iLEDs 60 in a passive-matrix configuration (e.g., as shown in FIG. 1) or to a pixel controller in an active-matrix configuration (not shown).

In operation, display controller 50 can provide control and data signals to row controller 30 and column controller 40. In turn, row controller 30 and column controller 40 provide control and data signals, such as row-select and column-data signals, to rows and columns of pixels 10, respectively, through row wires 12 and column wires 14. Pixels 10 receive the control and data signals and emit light in response, for example from micro-iLED(s) 60 in pixels 10.

As will be understood by those knowledgeable in the display arts, rows and columns are arbitrary designations and can be interchanged in various embodiments.

Groups, e.g., sub-arrays, of pixels 10 can form pixel clusters 20. Pixel clusters 20 can each comprise a two-dimensional sub-array of mutually exclusive pixels 10 and can, together, form an array of pixel clusters 20, each having pixel rows 10R and pixel columns 10C on display substrate 16, as shown in FIG. 2. According to embodiments of the present disclosure, a sub-array of mutually exclusive pixels 10 is also an array of pixels 10 and each pixel cluster 20 can be a display 90. Each pixel row 10R of pixels 10 in each pixel cluster 20 are connected (e.g., electrically connected) with a cluster row wire 22 and each pixel column 10C of pixels 10 in each pixel cluster 20 are connected (e.g., electrically connected) with a cluster column wire 24 disposed on display substrate 16. Cluster row wires 22 and cluster column wires 24 in pixel clusters 20 are analogous to row wires 12 and column wires 14, respectively, in a display 90. Each pixel cluster 20 can be controlled by a cluster controller 26 that is connected (e.g., electrically connected) to cluster row wires 22 and cluster column wires 24 to control pixels 10 in pixel cluster 20 with power, ground, row-select, or column-data signals in an active-matrix or passive-matrix configuration. Each cluster controller 26 can be disposed within or adjacent to the sub-array of pixels 10 in pixel cluster 20 and at least a portion of (e.g., all of) some cluster controllers 26 can be disposed in display area 18, for example as shown in FIG. 2. Touch controller 80 can be integrated into cluster controller 26, as shown in FIG. 2, or can be a distinct (e.g., separate, individual, independent, or different) structure, for example a distinct integrated circuit.

Row wires 12 can be connected (e.g., electrically connected) to rows of cluster controllers 26 and column wires 14 can be connected (e.g., electrically connected) to columns of cluster controllers 26 in the array of pixel clusters 20, as shown in FIG. 2. Row controller 30 can provide row control signals (e.g., row-select signals) to rows of cluster controllers 26 through row wires 12 and column controller 40 can provide column control signals (e.g., column-data signals) to columns of cluster controllers 26 through column wires 14. Row wires 12 and column wires 14 between cluster controllers 26 are illustrated in FIG. 2 with dashes to show that the number of rows and columns of pixel clusters 20 in the cluster array can be variable, depending on the number of pixels 10 in each pixel cluster 20 and the number of pixels 10 in display 90. The number of rows and columns of pixels 10 in pixel clusters 20 can be the same, or the number of rows can be greater than the number of columns, or vice versa, in each pixel cluster 20. In some embodiments, the ratio can be no less than 2:1, 4:1, 8:1, 16:1, 32:1, or 64:1.

Each cluster controller 26 can be an integrated circuit having a substrate distinct (e.g., separate, individual, independent, or different) from display substrate 16 or any other cluster controller 26 or micro-iLED 60 and can be disposed on display substrate 16. FIG. 3A illustrates a pixel cluster 20 having a sub-array of pixels 10 arranged in pixel rows 10R and pixel columns 10C controlled by cluster controller 26 through cluster row wires 22 and cluster column wires 24 in pixel cluster 20; each cluster controller 26 can be controlled through a row wire 12 and column wire 14. As shown in FIG. 3B, in some embodiments cluster controller 26 comprises multiple integrated circuits disposed on display substrate 16 or can comprise multiple circuits formed in or on and native to display substrate 16, for example comprising some or all of cluster controller 26. Touch controller 80 can be integrated into pixel cluster controller 26, as shown in FIG. 3A, or in a distinct (e.g., separate) integrated circuit, as shown in FIG. 3B. According to embodiments of the present disclosure, cluster controller 26 (e.g., comprising pixel cluster row controller 26R and pixel cluster column controller 26C) is disposed between pixel rows 10R or pixel columns 10C of pixels 10 in pixel cluster 20 on display substrate 16. Using multiple integrated circuits in pixel cluster controller 26 (e.g., pixel cluster row controller 26R and pixel cluster column controller 26C, collectively cluster controller 26, and touch controller 80) can reduce the size of each integrated circuit and more readily enable the integrated circuits to be disposed between pixel rows 10R or pixel columns 10C of pixels 10 on display substrate 16. In embodiments, the integrated circuit(s) of cluster controllers 26 comprise a pixel cluster controller substrate (e.g., a semiconductor substrate) that is distinct (e.g., separate, individual, independent, or different) of display substrate 16 (e.g., a glass or polymer substrate).

In operation, display controller 50 can provide control and data signals to row controller 30 and column controller 40. In turn, row controller 30 and column controller 40 provide control and data signals, such as row-select and column-data signals, to rows and columns of cluster controllers 26, respectively, through row wires 12 and column wires 14. Each cluster controller 26 receives the control and data signals and then provides cluster control and cluster data signals to pixels 10 in pixel cluster 20 through cluster row wires 22 and cluster column wires 24. Pixels 10 in each pixel cluster 20 receive the cluster control and cluster data signals and emit light in response, for example from micro-iLED(s) 60 in pixels 10. At the same time, or in alternation, touch controller 80 senses touches in display area 18 and communicates them, for example to pixel cluster controller 26, row or column controllers 30, 40, or display controller 50, for example through row wires 12, column wires 14, or other wires on display substrate 16.

Cluster controllers 26 can provide active-matrix or passive-matrix control to pixels 10 in clusters 20. In some embodiments of the present disclosure, row controller 30 and column controller 40 provide active-matrix signals to cluster controllers 26 and cluster controllers 26 provide passive-matrix signals to pixels 10 in clusters 20. Such a mixed control architecture can reduce the number of control circuits in display 90 and the amount of semiconductor materials (e.g., silicon) necessary to construct display 90. Passive-matrix controlled pixel arrays are limited in size due to flicker, so large flat-panel displays are usually active-matrix displays, but the active-matrix control circuits in each pixel of an active-matrix display can be expensive and consume significant area on display substrate 16, limiting display resolution. By using active-matrix control of cluster controllers 26 and passive-matrix control of pixels 10 in each pixel cluster 20, the total amount of control circuitry and semiconductor material is reduced with a consequent cost savings and avoiding flicker (since the size of pixel cluster 20 pixel 10 sub-arrays can be much smaller than the size of pixel 10 arrays in display 90, e.g., no less than 2, 4, 8, 16, 32, 64, or 128 times smaller in either or both array dimensions).

Embodiments of the present disclosure enable integrated touch sensing in a display 90. According to some embodiments, row controller 30 or cluster controller 26 comprises a touch controller 80, for example a self-capacitance touch controller, an absolute-capacitance touch sensor controller, a mutual-capacitance touch controller, or an optical controller (all referred to generically as a touch controller 80) that can detect touches in the array of pixels 10 in display 90 or in the sub-array of pixels 10 in each pixel cluster 20. In some electro-capacitance embodiments, touch sense signals can be transmitted on row wires 12 and sensed on orthogonal column wires 14, or vice versa, under the control of touch controller 80. Alternatively, additional electrodes (e.g., disposed orthogonally to electrodes used for transmitting touch sense signals) can be added to display substrate 16 for either transmitting or receiving touch sense signals, for example on a top surface layer of display substrate 16 that can provide the best signal-to-noise ratio with respect to a touch implement such as a stylus or finger. The additional electrodes can be, for example, an optically transmissive indium tin oxide layer, and can be controlled by touch controller 80. The metallization for the sense electrodes should have enough electric field strength to sense a touch on top of any display glass in display 90 (e.g., disposed over display substrate 16. In some embodiments employing absolute-capacitance sensing, display electrodes (e.g., row and column wires 12, 14) in various configurations can create sense electrodes for a touch sensor. In a mutual capacitive sensor, display electrodes (e.g., row and column wires 12, 14) in various configurations can form transmit electrodes (layer) for a touch sensor. The associated sensing (receive) electrode (layer) can use a similar electrode structure.

If implemented in each pixel cluster 20, as shown in FIG. 1, the touch controllers 80 of each pixel cluster 20 can operate independently within each pixel cluster 20 and can send a touch sense signal (e.g., an interrupt) to row controller 30, column controller 40, or display controller 50. Thus, according to embodiments of the present disclosure, display 90 can comprise a plurality of touch controllers 80 that operate independently. Each touch controller 80 can be associated with a touch sensor in each pixel cluster 20 and can be physically disposed within or adjacent to pixel cluster 20 and in an array within display area 18, enabling touch sensing in multiple locations with display area 18. Multiple touch controllers 80 can enable faster touch sensing, since each touch controller 80 can operate independently and at the same time, and can be more sensitive, since the area of each touch sensor can be smaller and have less parasitic capacitance or resistance.

Touch controllers 80 can be disposed on display substrate 16 within display area 18. According to some embodiments, each touch controller 80 can be provided as an integrated circuit with a touch-controller substrate distinct (e.g., separate, individual, independent, or different) from display substrate 16, a substrate of cluster controller 26, or any other touch-controller substrate, for example as shown in FIGS. 1 and 3B. According to some embodiments, touch controllers 80 can be provided as part of cluster controller 26 (or vice versa), for example in an integrated circuit with a substrate distinct (e.g., separate, individual, independent, or different) from display substrate 16 as shown in FIGS. 2 and 3A. Touch controllers 80 can receive touch sense signals from or send touch sense signals to, or both, cluster controller 26, display controller 50, row controller 30, or column controller 40. The touch sense signals can be communicated on row or column wires 12, 14 or on other additional wires (electrodes) provided for touch controller 80 or cluster controller 26. In some embodiments, touch sense control signals and touch sense response signals can be communicated on cluster row wires 22 or cluster column wires 24. Thus, according to some embodiments of the present disclosure, wires or conductive elements in display 90 or clusters 70 can be capacitive elements in a capacitive touch sensor. For example, in some display 90 embodiments according to the present disclosure, row wires 12, column wires 14, power wires or power planes, or ground wires or ground planes can be such capacitive elements in display 90. In some display 90 embodiments according to the present disclosure, cluster row wires 22, cluster column wires 24, power wires or power planes, or ground wires or ground planes in each pixel cluster 20 can be such capacitive elements.

Figure 4A:
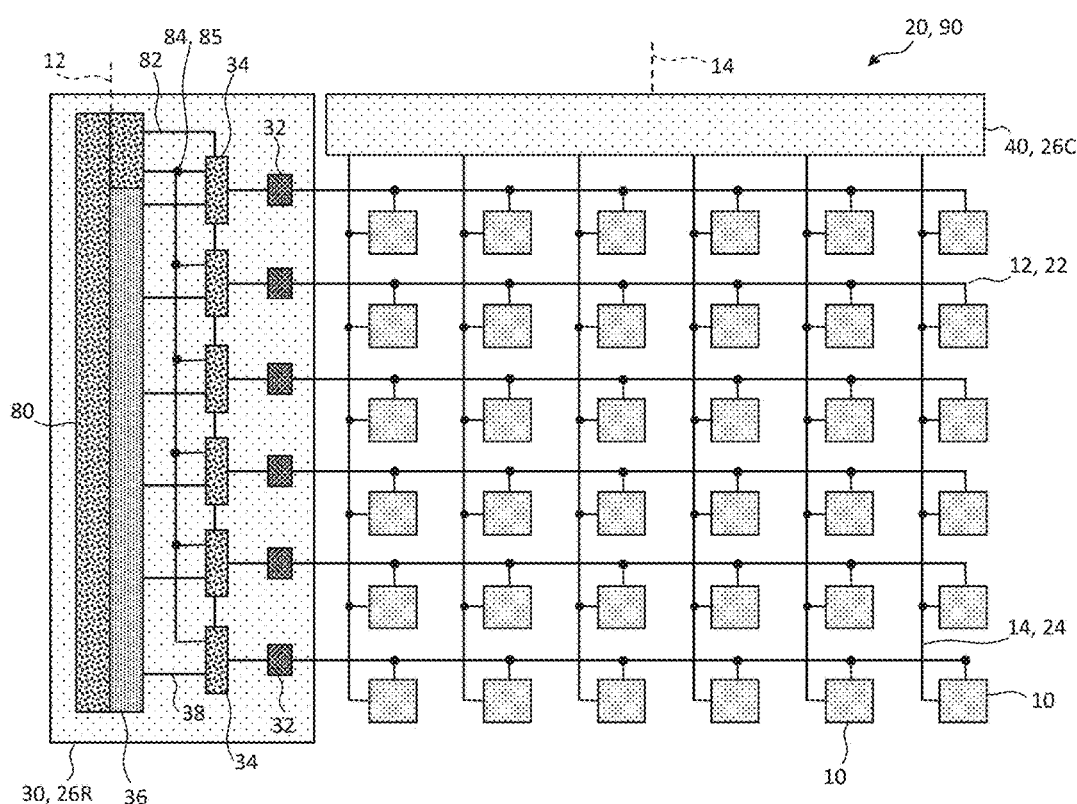
FIG. 4A is a schematic of a display or pixel cluster with an integrated row control circuit and touch controller according to illustrative embodiments of the present disclosure.

FIG. 4A illustrates embodiments according to the present disclosure in which row wires 12 in display 90 controlled by row controller 30 or in which cluster row wires 22 in each pixel cluster 20 controlled by cluster controller 26 (e.g., cluster row or column controllers 26R, 26C) provide display 90 or a sub-array of pixels 20 in a pixel cluster 20 with integrated touch sensing on a common substrate (e.g., display substrate 16). Touch controller 80 can be a part of or integrated into row controller 30, column controller 40, cluster controller 26 (as shown), or cluster row or column controllers 26R, 26C (not shown), or can be a separate circuit or integrated circuit, e.g., disposed on display substrate 16. Row controller 30 or cluster controller 26 can control row wires 12 or cluster row wires 22 to control pixels 10 in an array of pixels 10 (e.g., in display 90 or pixel cluster 20). Row wires 12 or cluster row wires 22 can also be used to send and receive touch sense signals, e.g., to measure changes in capacitance on row wires 12 or cluster row wires 22 to detect the presence (e.g., touch) of a finger. Such sent touch sense signals are touch sense control signals and such received touch sense signals are touch sense response signals. In some embodiments (not shown), touch controller 80 can be a part of or integrated into column controller 40 or second cluster column controller 26C and can control column wires 14 or cluster column wires 24 to control pixels 10 in an array of pixels (e.g., in display 90 or pixel cluster 20). Column wires 14 or cluster column wires 24 can also be used to send and receive touch sense signals, e.g., to measure changes in capacitance on column wires 14 or cluster column wires 24 to detect the presence (e.g., touch) of a finger. Such sent touch sense signals are touch sense control signals and such received touch sense signals are touch sense response signals.

According to some embodiments of the present disclosure, row controller 30 or cluster controller 26 comprising display control circuit 36 scans through row wires 12 or cluster row wires 22, respectively, to drive display control signals 38 (e.g., row-select signals) for controlling pixels 10 in display 90 or in pixel cluster 20 during a frame period (e.g., a temporal interval) to emit light. According to some embodiments of the present disclosure, column controller 40 or cluster controller 26 comprising display control circuit 36 scans through column wires 14 or cluster column wires 24, respectively, to drive display control signals 38 (e.g., column-data signals) for controlling pixels 10 in display 90 or in pixel cluster 20 during the frame period to emit light. During a subsequent blanking period (e.g., a temporal interval) in which pixels 10 do not emit light, touch controller 80 scans through row wires 12 or cluster row wires 22 or scans through column wires 14 or cluster column wires 24 to send and receive touch sense signals for sensing touches in display area 18 in display 90 or in pixel cluster 20. A blanking period is also a sensing period. Thus, according to some embodiments, each cluster controller 26 is operable to provide a display control signal 38 to pixel cluster rows 10R or pixel cluster columns 10C of pixels 10 during a frame period and is operable to sense the cluster row wires 22, cluster column wires 24, or both during a blanking period to receive a touch sense signal. Thus, in some embodiments image data display and touch sensing alternate in time in display 90 or pixel cluster 20.

Each pixel cluster 20 can independently sense touches in its sub-array of pixels 10, requiring less time to scan through the smaller number of cluster row wires 22 or cluster column wires 24 in each pixel cluster 20 than to scan all of the row wires 12 or cluster column wires 24 in display 90, increasing touch detection speed, rate, and sensitivity. As shown in FIG. 4A, row controller 30 or pixel cluster row controller 26R can comprise drivers 32 that receive signals from a select circuit 34 controlled by touch controller 80 (a touch control circuit) through common touch-select signal 82 to select between a display control signal 38 (e.g., a row-select signal) and a touch sense control signal 84. Drivers 32 can comprise one or more drive transistors, select circuit 34 can comprise digital circuits, for example comprising a multiplexer, and touch controller 80 can be a processor or state machine in one or more integrated circuits. Those knowledgeable in circuit design will appreciate that a variety of circuits can enable various embodiments of the present disclosure.

Figure 4B:
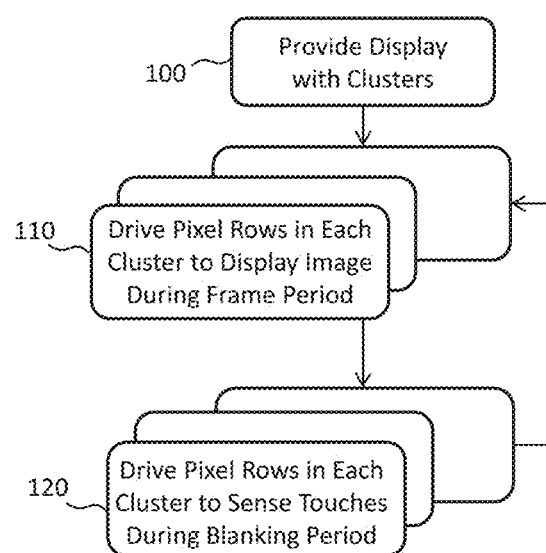
FIG. 4B is a flow diagram useful with the display or pixel cluster of FIG. 4A according to illustrative embodiments of the present disclosure.
Figure 4C:
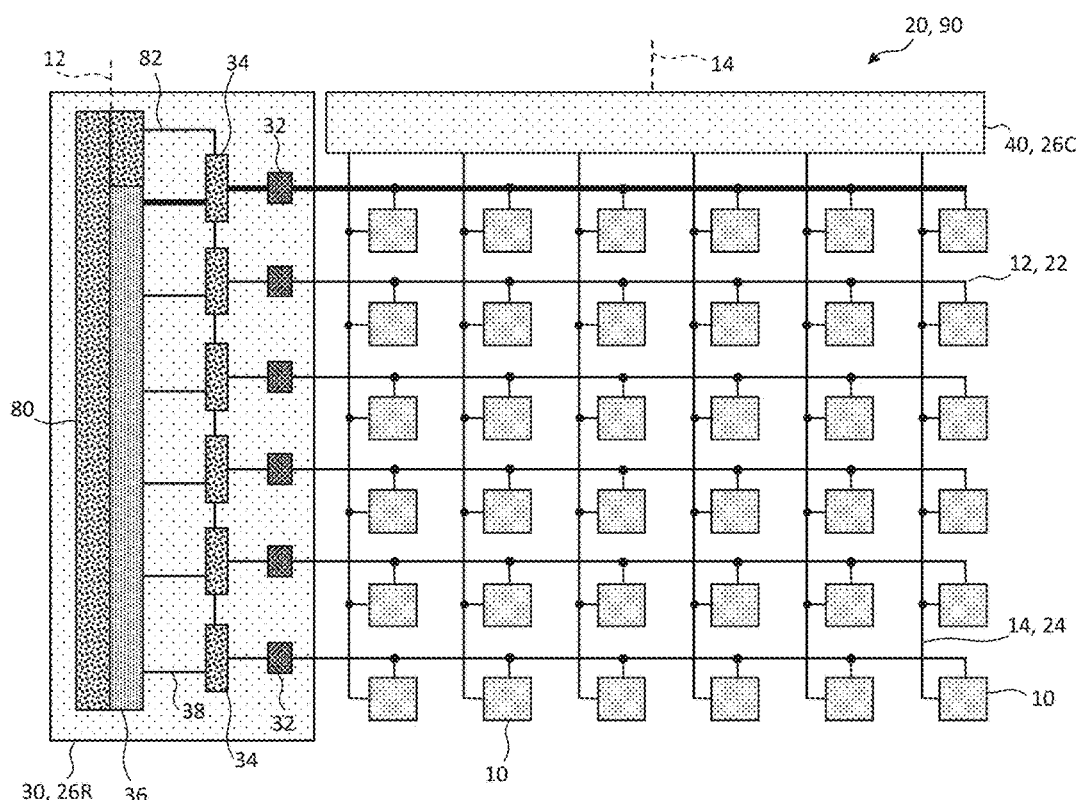
FIG. 4C is a schematic of a display or pixel cluster with an integrated row control circuit and touch controller during an active frame period according to illustrative embodiments of the present disclosure.
Figure 4D:
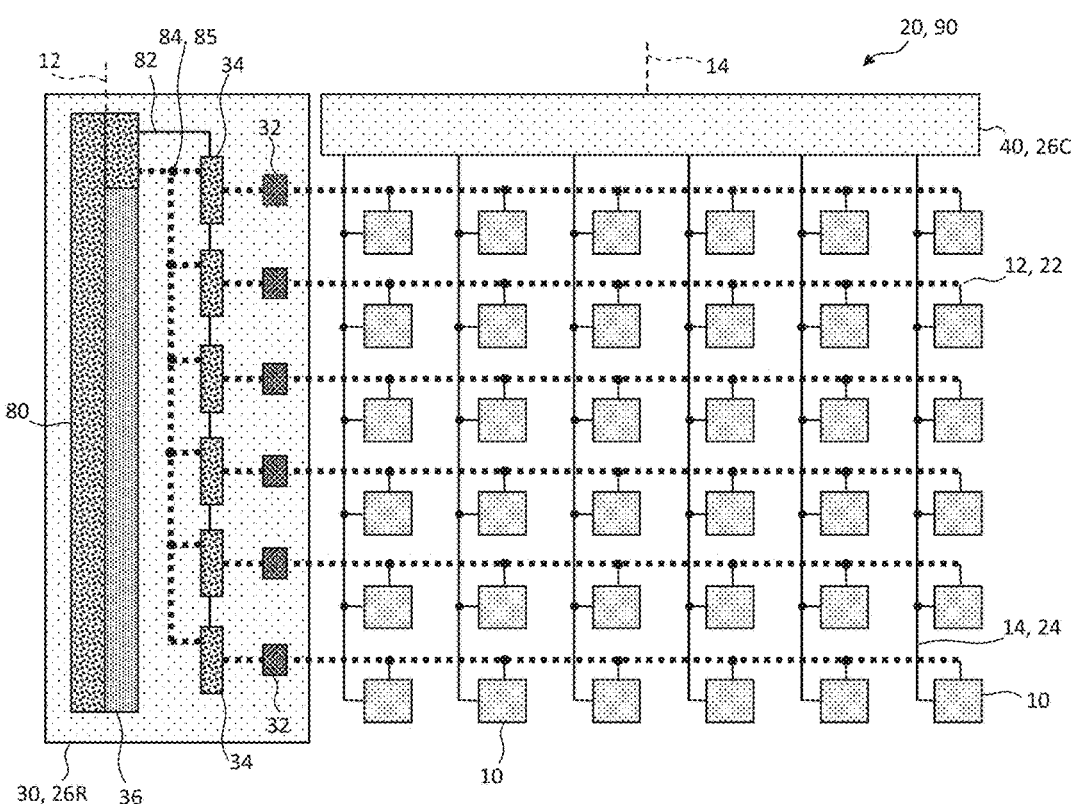
FIG. 4D is a schematic of a display or pixel cluster with an integrated row control circuit and touch controller during an active blanking period according to illustrative embodiments of the present disclosure.

As illustrated in the flow diagram of FIG. 4B, a display 90 with clusters 70 is provided in step 100. Pixel cluster rows 10R in each pixel cluster 20 are simultaneously (as indicated with the multiple illustrated flow diagram boxes 110) driven to display image data in the pixel cluster 20 and emit light, for example display image data as provided by row controller 30 and column controller 40 and received from display controller 50, during a frame period in step 110. As part of step 110, display control circuit 36 sequentially transmits a display control signal 38 onto each row wire 12 or cluster row wire 22 to display a complete set of data image signals on the pixel 10 array in display 90 or sub-array of pixels 10 in pixel cluster 20. FIG. 4C illustrates this step, showing only the display control signal 38 driven onto row wires 12 or cluster row wires 22, with the first row wire 12 or cluster row wire 22 highlighted with a darker line. Subsequently (or before), in step 120, touch controller 80 uses the pixel cluster rows 10R in each pixel cluster 20 (as shown with the multiple illustrated flow diagram boxes 120) either sequentially or with at least some in parallel to sense touches in pixel cluster 20 and any touch sense information is communicated, for example to row controller 30, column controller 40, or display controller 50, during a blanking (or sensing) period. All of touch controllers 80 in pixel clusters 20 can sense touches at the same time. FIG. 4D illustrates this step, showing only the touch sense control and response signals 84, 85 connected to row wires 12 or cluster row wires 22 with dashed dark lines. One or more row wires 12 or pixel cluster wires 22 can be active for touch sensing at the same time. FIG. 4D shows all of row wires 12 or pixel cluster wires 22 active at one time, but in some embodiments, a subset of row wires 12 or pixel cluster wires 22 are active together at a single time or individual or groups of row wires 12 or pixel cluster wires 22 are sequentially scanned to sense touches. In some embodiments, the sensing period is sufficiently short, e.g., no greater than 40 msec, 20 msec, 10 msec, 4 msec, or 1 msec, relative to the display period that no image flicker is observed in display 90 or pixel clusters 20. According to some embodiments, row wires 12 or cluster row wires 22 are used for touch sensing, as shown in FIG. 4A. According to some embodiments, not shown, column wires 14 or column cluster wires 24 or other electrical conductors are used for touch sensing.

Thus, according to embodiments of the present disclosure, a display 90 with integrated touch sensing comprises a plurality of pixel clusters 20. Each pixel cluster 20 comprises an array of pixels 10 disposed in pixel cluster rows 10R and pixel cluster columns 10C. A cluster controller 26 electrically connects to pixel cluster rows 10R with cluster row wires 22 and electrically connects to pixel cluster columns 10C with cluster column wires 24. Each cluster controller 26 in a pixel cluster 20 is operable to sense and report touches in the array of pixels 10 in the pixel cluster 20 at the same, or different, times.

Figure 5A:
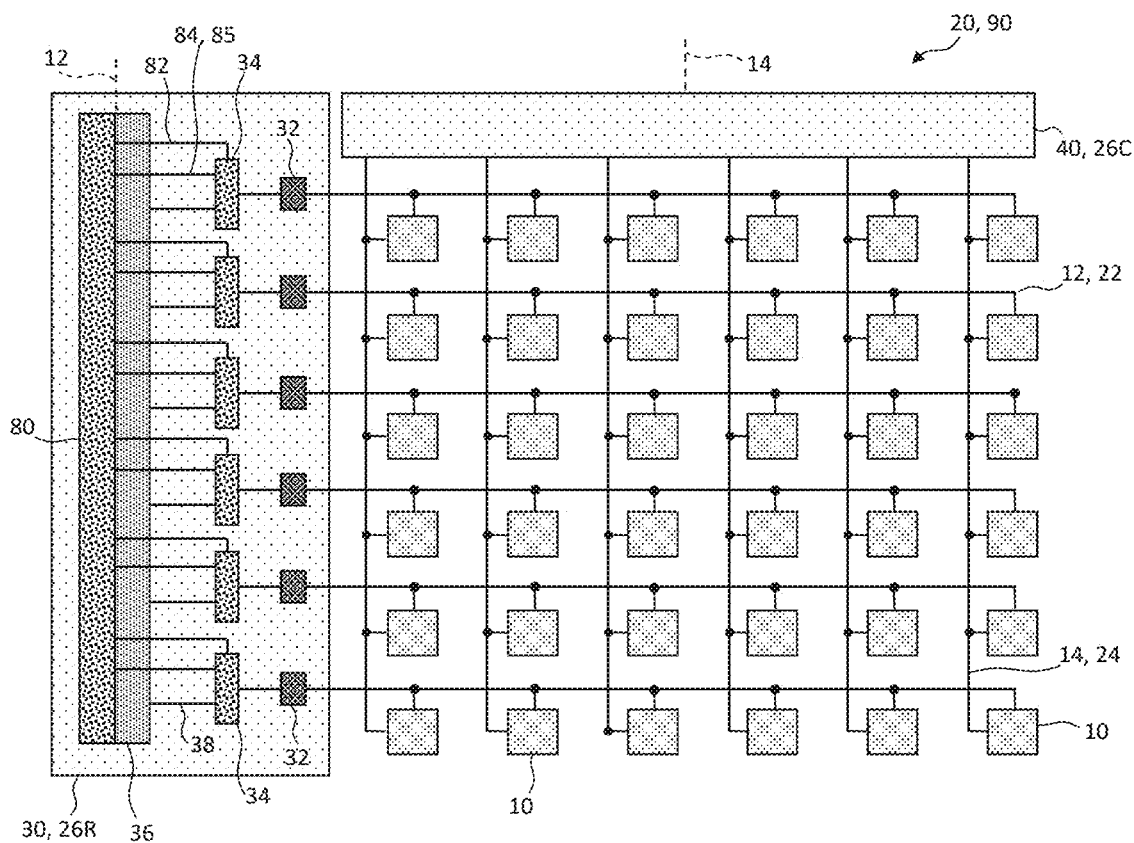
FIG. 5A is a schematic of a display or pixel cluster with an integrated row and touch controller according to illustrative embodiments of the present disclosure.

According to some embodiments of the present disclosure and as illustrated in FIG. 5A, row controller 30 or cluster controller 26 comprising display control circuit 36 scans through row wires 12 or cluster row wires 22, respectively, to drive display control signals 38 (e.g., such as row-select signals or column-data signals) for controlling pixels 10 in display 90 or pixel cluster 20 to emit light. At the same time, touch controller 80 scans through row wires 12 or cluster row wires 22 or scans through column wires 14 or cluster column wires 24 that are not driven with display control signals 38 to send and receive touch signals for sensing touches in display area 18 in display 90 or in pixel cluster 20. Thus, image data display and touch sensing are done at the same time on different portions of pixel 10 array in display 90 or pixel 10 sub-array in pixel cluster 20. FIGS. 4A and 5A differ in that in FIG. 4A all of row wires 12, 22 are controlled in common with a touch signal and in FIG. 5A row wires 12, 22 are individually and separately controlled. Thus, a given row wire 12 or cluster row wire 22 or a given column wire 14 or cluster column wire 24 is driven at a given time and any one, combination, or all of the remaining row wires 12 or cluster row wires 22 or remaining column wires 14 or cluster column wires 24 that are not driven with a display control signal 38 are used for touch sensing. By temporally overlapping the drive control signals 38 and touch sense control signals 84, no blanking or sensing time period is needed, increasing the possible frame rate and touch sensing rate of display 90.

Figure 5B:
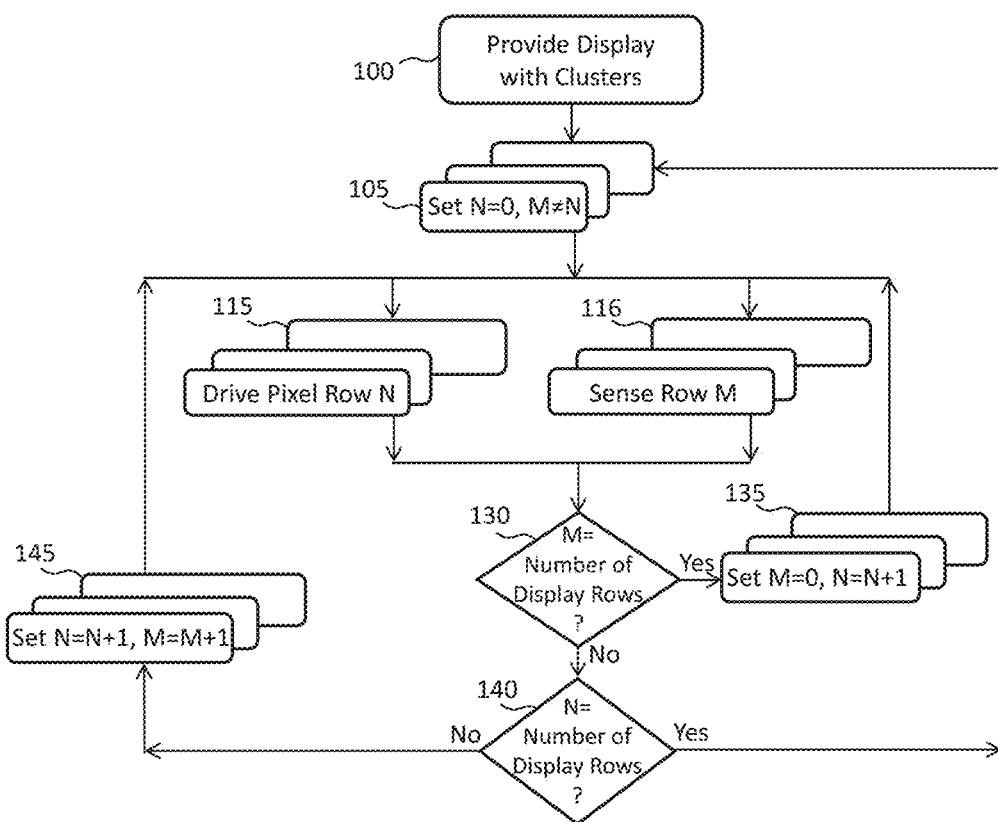
FIG. 5B is a flow diagram useful with the display or pixel cluster of FIG. 5A according to illustrative embodiments of the present disclosure.
Figure 5C:
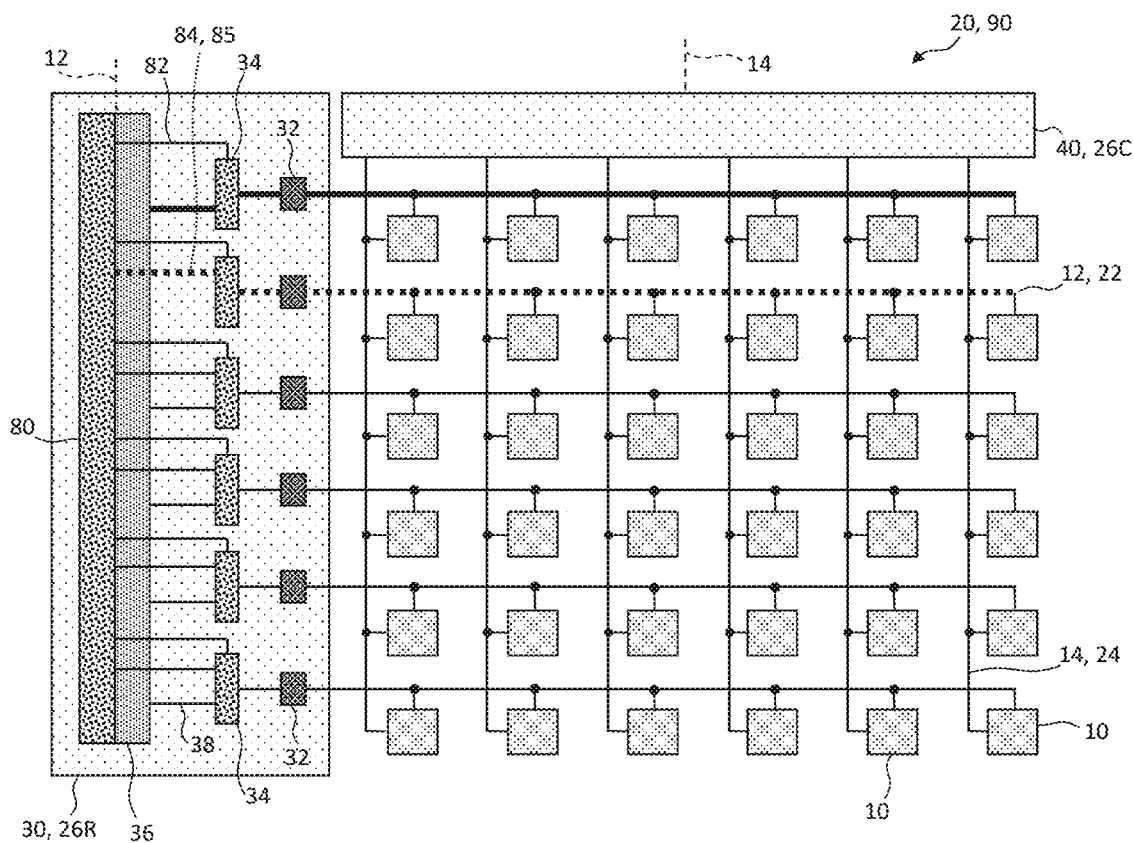
FIGS. 5C and 5D are schematics of a display or pixel cluster with an active row and touch controller according to illustrative embodiments of the present disclosure.
Figure 5D:
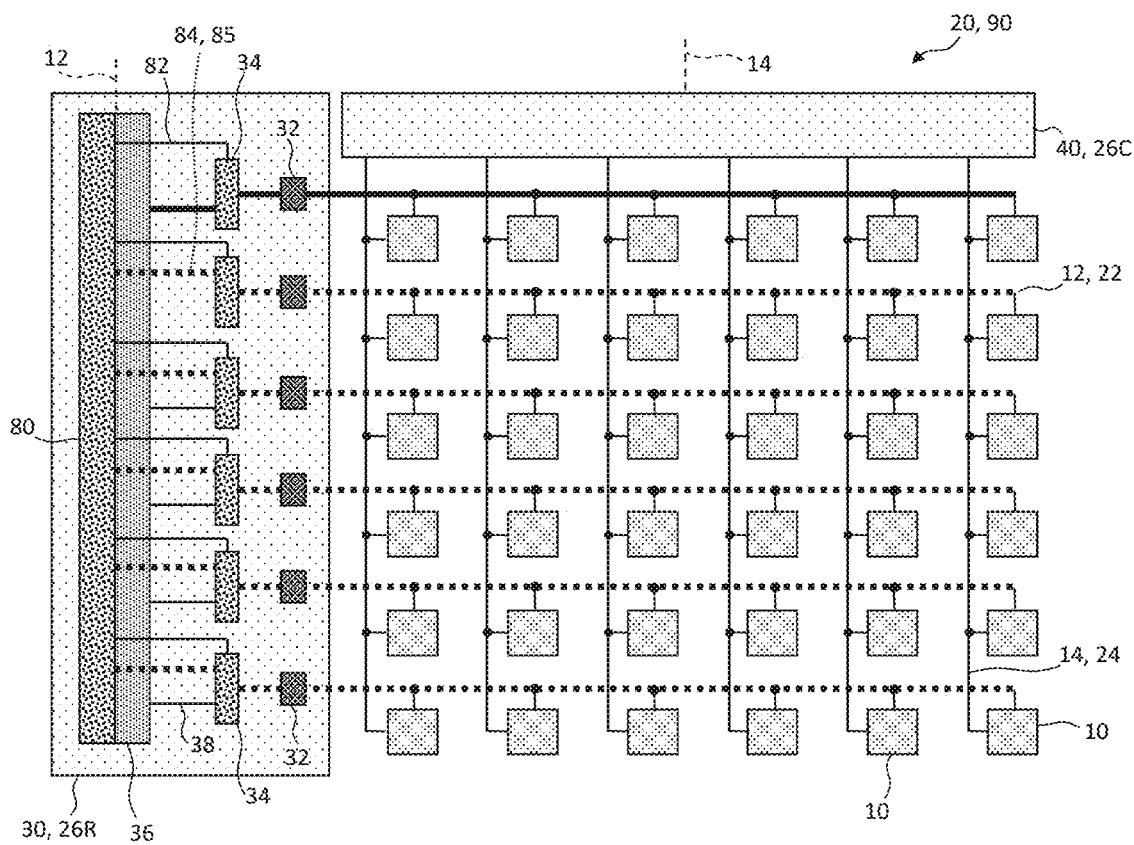

As illustrated in the flow diagram of FIG. 5B, a display 90 with clusters 70 is provided in step 100. Counters (e.g., touch sense row counter M and drive row counter N) are set in step 105 with M≠N (e.g., setting N=0 and M=1). Pixel cluster row 10R N in each pixel cluster 20 (e.g., as shown with the multiple illustrated flow diagram boxes in step 115) is driven with display image data in the pixel cluster 20 in step 115 by display control circuit 36, for example as provided by row controller 30 and column controller 40 and received from display controller 50. At the same time, a pixel cluster row 10R M different from pixel cluster row 10R N in each pixel cluster 20 (e.g., as shown with the multiple illustrated flow diagram boxes 116) senses any touch in step 116 and communicates any touch sense information by touch controller 80, for example to row controller 30, column controller 40, display controller 50, or cluster controller 26. FIG. 5C illustrates first row wire 12, 22 (e.g., row N=0) receiving display control signal 38 and second row wire 12, 22 (e.g., row M=1) transmitting touch sense control signal 84 and touch sense response signal 85. According to some embodiments, row wires 12 or cluster row wires 22 are used for touch sensing, as shown in FIG. 5A. Step 130 determines if the last row wire 12 or cluster row wire 22 was sensed in step 116 and, if so, sets the touch sense row counter M to zero and increments the drive row counter N in step 135, and then repeats steps 115 and 116. If not, step 140 determines if the last row wire 12 or cluster row wire 22 was driven in step 115 and, if so, sets the drive row counter N to zero and touch sense row counter M different from N. If not, drive row counter N and touch sense row counter M are incremented in step 145, and then steps 115 and 116 are repeated. FIG. 5C illustrates the active circuits and wires when N=0 and M=1, showing a highlighted (bold) row wire 12 or cluster row wire 22 on row 0 and a dashed row wire 12 or cluster row wire 22 on row 1. FIG. 5C illustrates embodiments in which only one pixel cluster row 10R M is used to sense touches at a time. In some other embodiments as illustrated in FIG. 5D, multiple pixel cluster rows 10R are sensed at the same time (e.g., some or all of pixel cluster rows 10R excluding pixel cluster row 10R N transmitting image data). In some embodiments, a subset of row wires 12 or pixel cluster wires 22 are active together at a single time or individual or groups of row wires 12 or pixel cluster wires 22 are sequentially scanned to sense touches.

Thus, according to embodiments of the present disclosure, a display 90 or pixel cluster 20 comprises an array of pixels 10 disposed in pixel rows 10R and pixel columns 10C (or pixel cluster rows 10R and cluster pixel columns 10C). A controller (e.g., row controller 30 or cluster controller 26) is electrically connected to pixel rows 10R with row wires 12 or row cluster wires 22 and electrically connected to pixel columns 10C with column wires 14 or cluster column wires 24. Row controller 30 or cluster controller 26 comprises a display control circuit 36 operable to drive a first row wire 12 or first cluster row wire 22 with a display signal and a touch controller 80 operable to drive or receive one or more second row wires 12 or second cluster row wires 22 all different from the first row wire 12 or cluster row wire 22 with a touch sense control signal 84 or touch sense receive signal 85 at the same time. Touch sense signals can either be a touch sense control signal 84 provided on second row wire 12 or cluster row wire 22 or a touch sense response signal 85 received from second row wire 12 or second cluster row wire 22. Display control circuit 36 can drive display control signals 38 onto each first row wire 12 or cluster row wire 22 temporally in sequence. Similarly, touch controller 80 can drive touch sense control signals 84 onto each second row wire 12 or cluster row wire 22 and receive touch sense response signals 85 temporally in sequence, wherein first row wires 12 are never the same wire as second row wire 12 at a given moment.

When temporally overlapping some drive control signals 38 and touch sense control signals 84 on display 90, column wires 14 or cluster column wires 24 that transmit column-data signals are not available as a conductive element in a capacitive touch sensor. In some such embodiments, clusters 70 arranged in a two-dimensional array can provide a second, e.g., row, dimension where given cluster row wires 22 provide the column dimension. Thus, displays 90 with clusters 70 that use cluster row and column wires 22, 24 and a local touch controller 80 in each pixel cluster 20 can effectively provide a two-dimensional capacitive touch sensor without requiring additional wires on display substrate 16.

When sensing a touch, a single row wire 12, cluster row wire 22, column wire 14, or cluster column wire 24 can serve as an electrical conductor or capacitive element in a capacitive touch element. However, a single electrical conductor (e.g., a row wire 12 or cluster row wire 22) can have a smaller sensing area than can be desired. In many cases, a touch screen has a lower resolution than pixels in a display screen. Consequently, and according to embodiments of the present disclosure, touch controller 80 can drive and sense multiple different conductors at a single common same time, for example sense two or more row wires 12, two or more cluster row wires 22, two or more column wires 14, or two or more cluster column wires 24 at a same time. The multiple conductors increase the sensed area. In some other embodiments, multiple different conductors are separately scanned over time to increase the sensed area. The multiple conductors can be spatially adjacent (e.g., neighboring row wires 12 or cluster row wires 22) or can be separated by other conductors (e.g., every other, every fourth, every eighth, etc. row wires 12 or cluster row wires 22). In some embodiments, all of row wires 12 or cluster row wires 22 are sensed at a time, so that only one touch can be detected in display 90 or in each pixel cluster 20. As illustrated in FIG. 5A, each select circuit 34 can be individually controlled with a separate and individual touch-select signal 82 to control a touch sense control signal 84 on each row wire 12 or cluster row wire 22.

Thus, according to embodiments of the present disclosure, a display 90 with integrated touch sensing comprises an array of pixels 10 disposed in pixel rows 10R and pixel columns 10C, a touch controller 80 electrically connected to the pixel rows 10R with row wires 12 and electrically connected to the pixel columns 10C with column wires 14. Touch controller 80 can be operable to drive a touch sense control signal onto or to receive a touch sense response signal from two or more row wires 12, two or more column wires 14, or both, at a same time. According to embodiments of the present disclosure, a display 90 with integrated touch sensing comprises an array of pixels 10 comprising clusters 70 of sub-arrays of pixels 10 disposed in pixel cluster rows 10R and pixel cluster columns 10C. A touch controller 80 is electrically connected to the pixel cluster rows 10R with cluster row wires 22 and electrically connected to pixel cluster columns 10C with cluster column wires 24. Touch controller 80 is operable to drive a touch sense control signal onto or to receive a touch sense response signal from two or more cluster row wires 22, two or more cluster column wires 24, or both, at a same time. FIG. 5A illustrates a display 90 or pixel cluster 20 similar to that of FIG. 4A, except that the select circuits 34 are individually controlled so that display control circuit 36 can drive a row wire 12 or cluster row wire 22 with a display control signal 38 at the same time that one or more different row wires 12 or cluster row wires 22 are controlled to sense a touch with touch sense control signal 84 and/or touch sense response signal 85.

According to some embodiments of the present disclosure, multiple row wires 12 or cluster row wires 22 are controlled with a common touch sense signal at the same time. By controlling multiple row wires 12 or cluster row wires 22 in common, a greater area is sensed at a given time, increasing the touch sense rate, sensitivity, and signal-to-noise ratio of the sensing, at the expense of touch sense resolution. However, since most displays 90 have a much lower touch resolution than display resolution, such a trade-off can be acceptable, and even preferred in some embodiments.

Figure 6A:
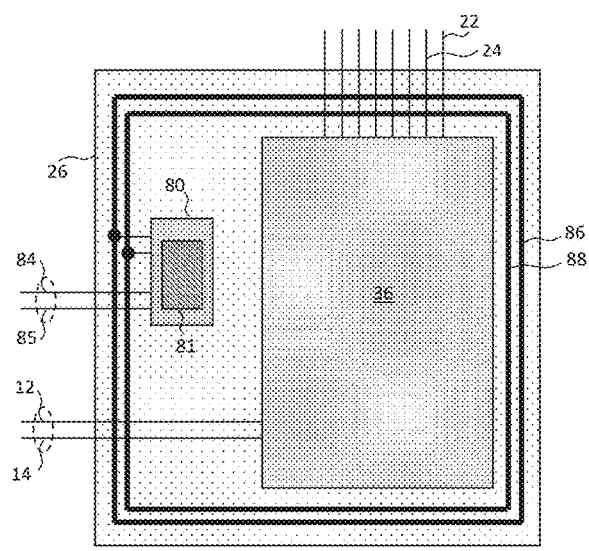
FIG. 6A is a schematic of a pixel cluster controller with an integrated sense capacitor according to illustrative embodiments of the present disclosure.
Figure 6B:
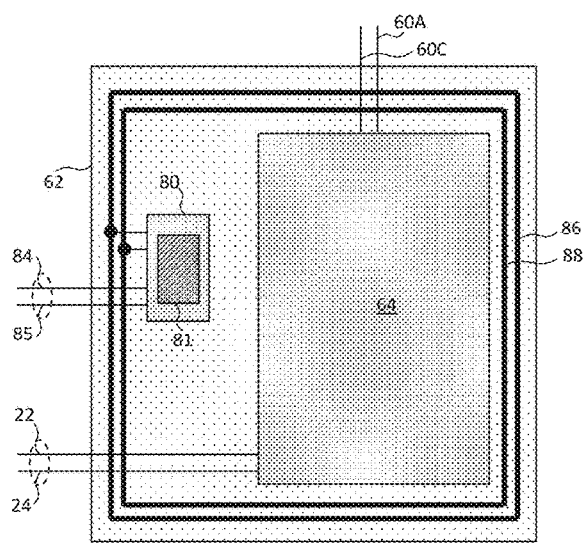
FIG. 6B is a schematic of a pixel controller with an integrated sense capacitor according to illustrative embodiments of the present disclosure.

According to some embodiments of the present disclosure, a touch sense capacitor is disposed on or in, e.g., formed on or in and native to, an integrated circuit such as cluster controller 26 or touch controller 80, rather than comprising a row wire 12, cluster row wire 22, column wire 14, or cluster column wire 24 disposed on display substrate 16. FIG. 6A illustrates a cluster controller 26 comprising touch controller 80 and display control circuit 36. FIG. 6B illustrates a pixel controller 62 comprising touch controller 80 and pixel control circuit 64. Touch controller 80 controls and senses one or more wires (e.g., first capacitor wire 86 and second capacitor wire 88) formed on or in and native to an integrated circuit with a substrate (e.g., a cluster controller 26 substrate) distinct (e.g., separate, individual, independent, or different) from display substrate 16 or any micro-iLED 60 substrate. In some embodiments, touch controller 80 can be provided in an integrated circuit separately from either cluster controller 26 (e.g., as shown in FIG. 3B) or pixel controller 62 having a substrate separate, individual, independent, and different from display substrate 16, a cluster controller 26 substrate, or a pixel controller 62 substrate.

A touch sense capacitor formed, disposed on or in, and native to cluster controller 26 provides a single touch area for each pixel cluster 20. A touch sense capacitor formed, disposed on or in, and native to pixel controller 62 provides a single touch area for each pixel 10, typically at a much higher spatial resolution than the single touch area for each pixel cluster 20. Where touch controller 80 is connected to a single capacitor conductor (e.g., first capacitor wire 86), touch controller 80 can provide a self-capacitance touch sensor; where touch controller 80 is connected to two capacitor conductors (e.g., first capacitor wire 86 and second capacitor wire 88, as shown in FIGS. 6A, 6B), touch controller 80 can provide a mutual-capacitance touch sensor. A touch sense capacitor can also comprise an electrical conductor such as a power wire, ground wire, power plane, or ground plane in touch controller 80. According to some embodiments, a touch sense capacitor disposed in an integrated circuit can comprise a capacitor wire (e.g., first capacitor wire 86) disposed around a perimeter of the touch-controller substrate, touch control circuit 81, cluster controller 26, cluster controller substrate, micro-iLED control circuit 64, micro-iLED controller 62, or micro-iLED controller substrate. According to some embodiments, a touch sense capacitor disposed in an integrated circuit can comprise two capacitor wires (e.g., first and second capacitor wires 86, 88) disposed adjacent to each other around a perimeter of the touch-controller substrate or touch control circuit 81. A single capacitor wire (e.g., first capacitor wires 86) can comprise a conductor in a self-capacitance capacitor; two capacitor wires (e.g., first and second capacitor wires 86, 88) can comprise two conductors in a mutual-capacitance capacitor. First capacitor wire 86 and second capacitor wire 88 can be interdigitated. Either of first capacitor wire 86 or second capacitor wire 88 can be or can be connected to a power wire, ground wire, power plane, or ground plane. A touch capacitor disposed in an integrated circuit can reduce or obviate the need for wiring used for touch sensing on display substrate 16. In some embodiments, for example when implemented on a semiconductor-on-insulator substrate, a touch capacitor can be more sensitive, for example with reduced parasitic capacitance or reduced parasitic resistance.

As shown in FIGS. 6A and 6B, touch controller 80 can be controlled by and communicate through touch sense control signals 84 and touch sense response signals 85, for example signals transmitted on separate wires on display substrate 16 or through other wires such as row wires 12 or column wires 14. Where touch controller 80 is integrated into or incorporated with display control circuit 36 in cluster controller 26, as in FIG. 6A, row wires 12 and column wires 14 can control cluster controller 26 and touch controller 80. Cluster controller 26 can control pixels 10 connected to cluster controller 26 through cluster row wires 22 and cluster column wires 24. Where touch controller 80 is integrated into or incorporated with micro-iLED control circuit 64 in micro-iLED controller 62, as in FIG. 6B, cluster row wires 22 and cluster column wires 24 can control micro-iLED controller 62 and touch controller 80. Micro-iLED control circuit 64 can control micro-iLEDs 60 connected to micro-iLED controller 62 through anode conductors 60A and cathode conductors 60C.

Thus, according to embodiments of the present disclosure, a touch-screen control system comprises a display substrate 16, an array of micro-iLEDs 60 disposed in pixel rows 10R and pixel columns 10C on display substrate 16 in a display area 18, and a touch controller 80 comprising a touch controller substrate distinct (e.g., separate, individual, independent, or different) from display substrate 16. The touch controller substrate can be disposed on display substrate 16 within display area 18. A touch control circuit 81 can be disposed in or on the touch controller substrate and a capacitor conductor (e.g., first capacitor wire 86 or second capacitor wire 88, or both) disposed in or on the touch controller substrate. Touch controller 80 can be a part of a cluster controller 26 or a part of micro-iLED controller 62 or can be a separate integrated circuit. Thus, the touch controller substrate can be the cluster controller substrate, the micro-iLED controller substrate, or a distinct (e.g., separate) integrated circuit substrate. In some such embodiments, an entire touch-detection system (e.g., comprising touch controller 80 and capacitors) can be integrated in an integrated circuit and the capacitor elements are not all necessarily disposed on display substrate 16. This simplifies the display 90 and reduces the functions required of row wires 12, column wires 14, cluster row wires 22, and cluster column wires 24. Because display 90 can comprise many pixel clusters 20 or pixels 10 in a regular array, each with a touch controller 80 and touch capacitor, some such embodiments can provide a useful touch resolution with excellent sensitivity and signal-to-noise ratio over a reasonable touch area.

In some embodiments of the present disclosure, the touch controller substrate is a semiconductor substrate, e.g., an integrated circuit substrate. Display substrate 16 can be a dielectric substrate. Examples of suitable touch control circuits 81 are known in the art and can be used in some embodiments of the present disclosure.

Figure 7A:
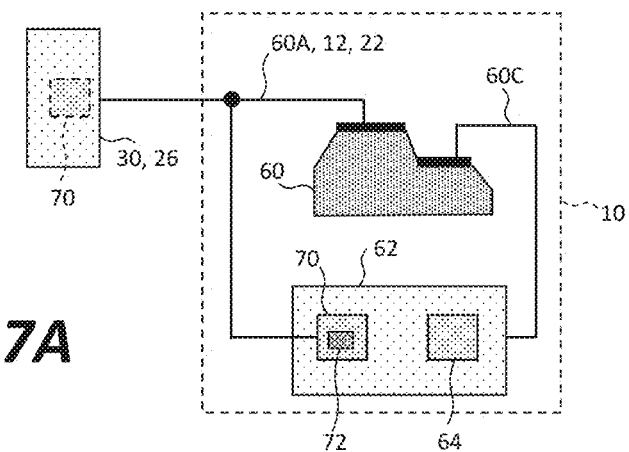
FIG. 7A is a schematic of a micro-iLED connected to a signal circuit in a common integrated circuit with a micro-iLED controller according to illustrative embodiments of the present disclosure.
Figure 7B:
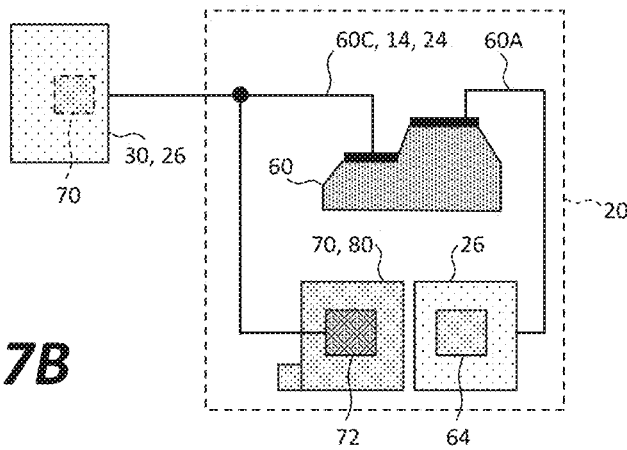
FIG. 7B is a schematic of a micro-iLED connected to a signal circuit in an integrated circuit separate from a cluster controller according to illustrative embodiments of the present disclosure.

In some embodiments of the present disclosure and as illustrated in FIGS. 7A and 7B, touch control signals can be transmitted with a relatively high-frequency modulation of signals provided on wires in display 90 connected directly to micro-iLEDs 60. For example, signals transmitted on row wires 12, cluster row wires 22, column wires 14, cluster column wires 24, anode conductors 60A, cathode conductors 60C, power lines, or ground lines can carry a high-frequency modulated signal of no less than one MHz. FIG. 7A illustrates signals transmitted on row wires 12 or cluster row wires 22 that are anode conductors 60A. FIG. 7B illustrates signals transmitted on column wires 14 or cluster column wires 24 that are cathode conductors 60C. However, in some embodiments, row wires 12 or cluster row wires 22 are connected to cathode conductors 60C or column wires 14 or cluster column wires 24 are connected to anode conductors 60A. In any case, high-frequency modulated signals can be transmitted or received by row controller 30 or cluster controller 26 and by a signal-extraction circuit 72 in a signal circuit 70, for example a circuit in micro-iLED controller 62 (shown in FIG. 7A) or touch controller 80 (shown in FIG. 7B). In some embodiments, signal circuit 70 is a part of touch controller 80, micro-iLED controller 62, cluster controller 26 (e.g., as shown in a common integrated circuit in FIG. 7A) or is a separate integrated circuit with a distinct (e.g., separate, individual, different, or independent) substrate, for example disposed on display substrate 16 (e.g., as shown in a separate integrated circuit in FIG. 7B). Circuits for modulating and receiving signals, e.g., with an alternating current modulation enabled through capacitive coupling, are known in the art and can be used in embodiments of the present disclosure.

According to embodiments of the present disclosure, micro-iLEDs 60 have a much smaller (e.g., no less than two times, five times, or ten times) capacitive load than other light modulation devices, such as liquid crystals. In some embodiments, micro-iLED 60 has a capacitance of no greater than 1 nanofarad so that high-frequency electrical signals can be provided on wires connected to micro-LED 60, in contrast to wires connected to other light emitters or light controllers, such as liquid crystals. Thus, displays 90 that use wires (e.g., power, ground, or signal wires) directly connected to one or more micro-iLEDs 60 can also provide a high-frequency modulation signal on the wires that can be used for touch sensing control and response, that is the wires can be a conductive element in a touch sensor capacitor. By also using wires for high-frequency signals, a need for additional wires routed on display substrate 16 is reduced or eliminated, saving space on display substrate 16 and enabling higher spatial pixel frequencies. In some embodiments, the wires used for high-frequency signals are disposed on a top metal layer on display substrate 16 closest to a surface of display substrate 16 and to a finger or stylus used for touching. The top metal layer wires are closer to the touching finger or stylus and are therefore more sensitive and responsive and have an improved signal-to-noise ratio for touch signals.

A micro-inorganic-light-emitting-diode control circuit (e.g., touch controller 80, touch control circuit 81, cluster controller 26, display control circuit 36, micro-iLED controller 62, or micro-iLED control circuit 64, any one of which can integrate touch circuitry) according to embodiments of the present disclosure and as shown in FIGS. 7A, 7B can comprise a micro-inorganic-light-emitting-diode (micro-iLED) 60 comprising one or more inorganic material layers that emit light when electrical current passes through the one or more inorganic layers, an anode (disposed in electrical contact with the one or more inorganic material layers, and a cathode disposed in electrical contact with the one or more inorganic material layers so that current passing from the anode to the cathode through the one or more inorganic material layers causes micro-iLED 60 to emit light. An anode conductor 60A is connected directly to the anode and provides electrical current to micro-iLED 60 and a cathode conductor 60C is connected directly to the cathode and receives electrical current from micro-iLED 60. One of anode conductor 60A or cathode conductor 60C is a signal conductor. A signal circuit 70 operable to provide or receive a control signal (e.g., a touch sense control signal 84 or a touch sense response signal 85) at a frequency of no less than one MHz on the signal conductor is connected to the signal conductor. Signal circuit 70 can comprise a signal-extraction circuit 72 that extracts the high-frequency signal on the signal conductor to obtain signal information and provides the signal information to touch controller 80.

FIG. 7A illustrates signal circuit 70 in micro-iLED controller 62; FIG. 7B illustrates signal circuit 70 in touch controller 80 and in an integrated circuit separate from cluster controller 26. In some embodiments, all of touch controller 80, signal circuit 70, and cluster controller 26 can be disposed in a common integrated circuit, for example in each pixel cluster 20. Optionally, signal circuit 70 (shown with dashed lines in FIGS. 7A and 7B) can be disposed in a row controller 30, column controller 40 (not shown in the Figures), or cluster controller 26, depending on the touch sensing control scheme desired in display 90. For example, signal circuit 70 can comprises micro-iLED controller 62 or cluster controller 26 or can be a part of touch controller 80 or vice versa. Signal circuit 70 can be a capacitive touch controller 80 and anode conductor 60A, cathode conductor 60C, or both, are capacitive touch electrical conductors. In some embodiments, anode conductor 60A is a power plane or cathode conductor 60C is a ground plane.

Similarly, according to some embodiments, display 90 comprises an array of pixels 10 disposed in pixel rows 10R and pixel columns 10C. The array of pixels 10 is divided into mutually exclusive pixel subsets, each subset a pixel cluster 20. Each pixel 10 comprises a micro-iLED 60, anode conductor 60A, cathode conductor 60C, and signal conductor. Each anode conductor 60A is commonly connected to micro-iLEDs 60 in each pixel row 10R of pixels 10 and each cathode conductor 60C is commonly connected to micro-iLEDs 60 in each pixel column 10C of pixels 10 in each pixel cluster 20. Signal circuit 70 in each pixel cluster 20 is connected to the signal conductor and operable to receive a control signal at a frequency of no less than one MHz on the signal conductor.

Figure 8:
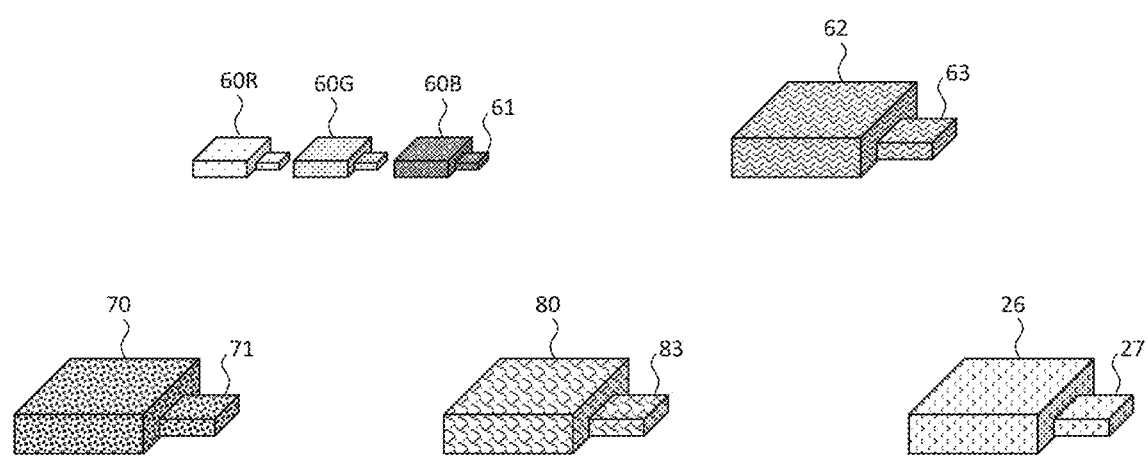
FIG. 8 is a perspective of components with tethers according to illustrative embodiments of the present disclosure.

In some embodiments and as shown in FIG. 8, micro-iLEDs 60 (e.g., red-light-emitting micro-iLED 60R, green-light-emitting micro-iLED 60G, or blue-light-emitting micro-iLED 60B, collectively micro-iLEDs 60), micro-iLED controllers 62, signal circuits 70, touch controllers 80, or cluster controllers 26 are each an individual integrated circuit comprising distinct (e.g., separate, different, or independent) substrates disposed in display 90 using micro-transfer printing and, consequently any of micro-iLEDs 60, signal circuits 70, micro-iLED controllers 62, touch controllers 80, or cluster controllers 26 can comprise a separated or broken (e.g., fractured) tether, e.g., micro-iLED tether 61, signal circuit tether 71, micro-iLED controller tether 63, touch controller tether 83, or cluster controller tether 27. The components shown in FIG. 8 can also comprise an integrated circuit substrate that is distinct (e.g., separate, different, or independent) from display substrate 16.

Pixel clusters 20 and pixels 10 can be disposed on or over a display substrate 16, for example a glass or polymer substrate, within a display area 18 comprising all of pixels 10 and at least some of cluster controllers 26. Display area 18 can be, for example, a convex hull on a surface of display substrate 16 comprising pixels 10. Thus, at least a portion or all of cluster controllers 26 can be disposed between pixels 10 on display substrate 16 in display area 18. In contrast, display row controller 30, display column controller 40, and display controller 50 can be disposed on display substrate 16 external to display area 18, for example adjacent to the edges or sides of display area 18 or provided on an external substrate. Display row controller 30, display column controller 40, and display controller 50 can be packaged integrated circuits with individual semiconductor substrates mounted on display substrate 16.

According to embodiments of the present disclosure, pixels 10 of pixel clusters 20 can comprise one or more light emitters, for example micro-iLEDs 60 that each emit different colors of light, for example red micro-iLEDs 60R that emit red light, green micro-iLEDs 60G that emit green light, and blue micro-iLEDs 60B that emit blue light when provided with enough current at a suitable voltage. Cluster row signals (e.g., cluster row-select signals transmitted on cluster row wires 22) and cluster column signals (e.g., cluster column-data signals transmitted on cluster column wires 24) can provide enough current at suitable voltages to drive each of micro-iLEDs 60 in each pixel 10 or a micro-iLED pixel controller 62. Display control signals 38 transmitted on row wires 12 and column wires 14 can comprise one or more of row-select, timing, or column-data signals but are not limited to such and can implement any suitable control and data function desired.

Pixels 10 can comprise light emitters 60 (e.g., micro-iLEDs 60) having a length or width no greater than one hundred microns, for example no greater than fifty microns, no greater than twenty microns, no greater than fifteen microns, no greater than twelve microns, or no greater than ten microns, and, optionally, a thickness no greater than fifty microns, for example no greater than twenty microns, no greater than ten microns, or no greater than five microns. Micro-iLEDs 60 can have a thickness no greater than 100 microns, 50 microns, 20 microns 10 microns, 5 microns, or 2 microns. Micro-iLEDs 60 can be bare, unpackaged die, for example integrated circuit die, and can be micro-transfer printed from a micro-light-emitting diode source wafer to display substrate 16 and can comprise a broken (e.g., fractured) or separated micro-iLED tether 61 as a consequence of micro-transfer printing. Such small light emitters 60 can provide space to dispose other circuits, such as touch controllers 80 on display substrate 16, for example as discussed in U.S. Pat. Nos. 9,991,163 and 9,799,719, to provide touch electrodes between micro-iLEDs 60, for example as discussed in U.S. Pat. Nos. 10,289,252, 9,799,719, and 10,170,535.

According to some embodiments of the present disclosure, cluster controllers 26 can likewise be unpackaged bare die, for example integrated circuit die, and can be micro-transfer printed from a cluster controller source wafer to display substrate 16 or other substrate and can comprise a broken (e.g., fractured) or separated cluster controller tether 27 as a consequence of micro-transfer printing. Cluster controller 26 can comprise an integrated circuit having a length or width no greater than five hundred microns, for example no greater than 250 microns, no greater than 100 microns, no greater than 50 microns, or no greater than 20 microns, or no greater than 10 microns, and a thickness no greater than fifty microns, for example no greater than twenty microns, no greater than ten microns, or no greater than five microns. Cluster controller 26 can comprise one or more integrated circuits, for example unpackaged, micro-transfer printed, bare die disposed at least partly or completely between pixels 10 providing cluster controller 26, (or cluster row controller 26R and cluster column controller 26C) to enable passive- or active-matrix control of pixels 10. Micro-transfer printed integrated circuits, for example micro-iLEDs 60, are relatively small and can therefore be provided at a high density and resolution on display substrate 16. Likewise, cluster controllers 26 can be very small and can therefore be provided between pixels 10 in display area 18 on or over display substrate 16.

According to embodiments of the present disclosure, micro-iLEDs 60 emit light most efficiently at a particular current. This efficient current can be different for different micro-iLEDs 60, for example micro-iLEDs 60 made with different materials or that emit different colors of light. It is useful, therefore, to operate micro-iLEDs 60 at their most efficient current to provide a power-efficient display 90 and to select different efficient currents for different corresponding types of micro-iLEDs 60.

Figure 9:
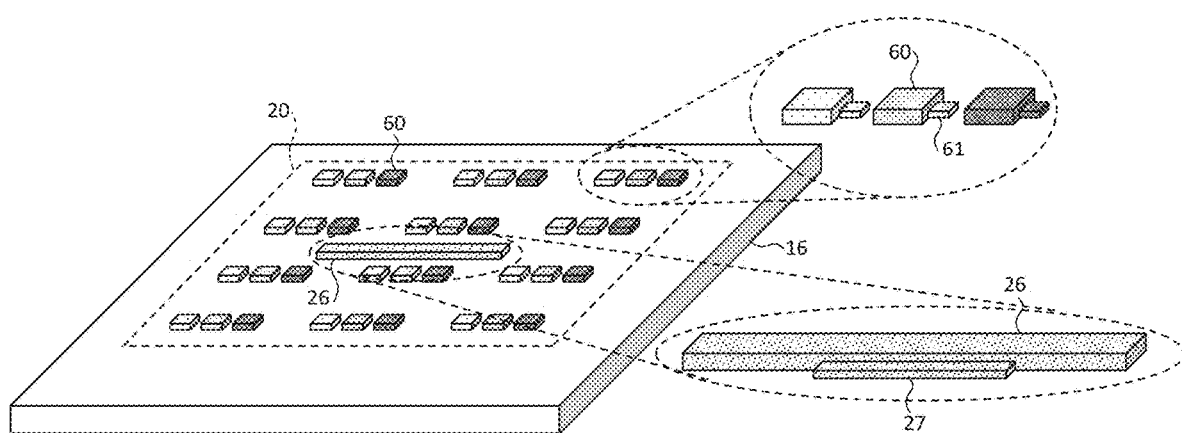
FIG. 9 is a perspective of components disposed directly on a display substrate according to illustrative embodiments of the present disclosure.

A display 90 according to embodiments of the present disclosure can comprise micro-iLEDs 60 made with compound semiconductor materials and micro-iLED substrates distinct (e.g., separate, different, or individual) from display substrate 16. As shown in FIG. 9, each micro-iLED 60 can comprise a broken (e.g., fractured) or separated micro-iLED tether 61 broken (e.g., fractured) or separated as a consequence of micro-transfer printing micro-iLEDs 60 from a micro-iLED source wafer (e.g., a compound semiconductor substrate such as GaN or GaAs) to display substrate 16. Similarly, cluster controller 26 can comprise a broken (e.g., fractured) or separated cluster controller tether 27 broken (e.g., fractured) or separated as a consequence of micro-transfer printing cluster controller 26 from a cluster-controller source wafer (e.g., a semiconductor substrate such as silicon) to display substrate 16. In some embodiments micro-iLEDs 60 and cluster controller 26 are disposed directly on display substrate 16 or directly on layers (e.g., planarization or encapsulation layers) disposed on display substrate 16. FIG. 9 illustrates one pixel cluster 20 disposed on display substrate 16 but displays 90 of the present disclosure can comprise multiple pixel clusters 20 disposed on display substrate 16, for example an array of pixel clusters 20 defining a display area 18 as shown in FIG. 1.

Figure 10:
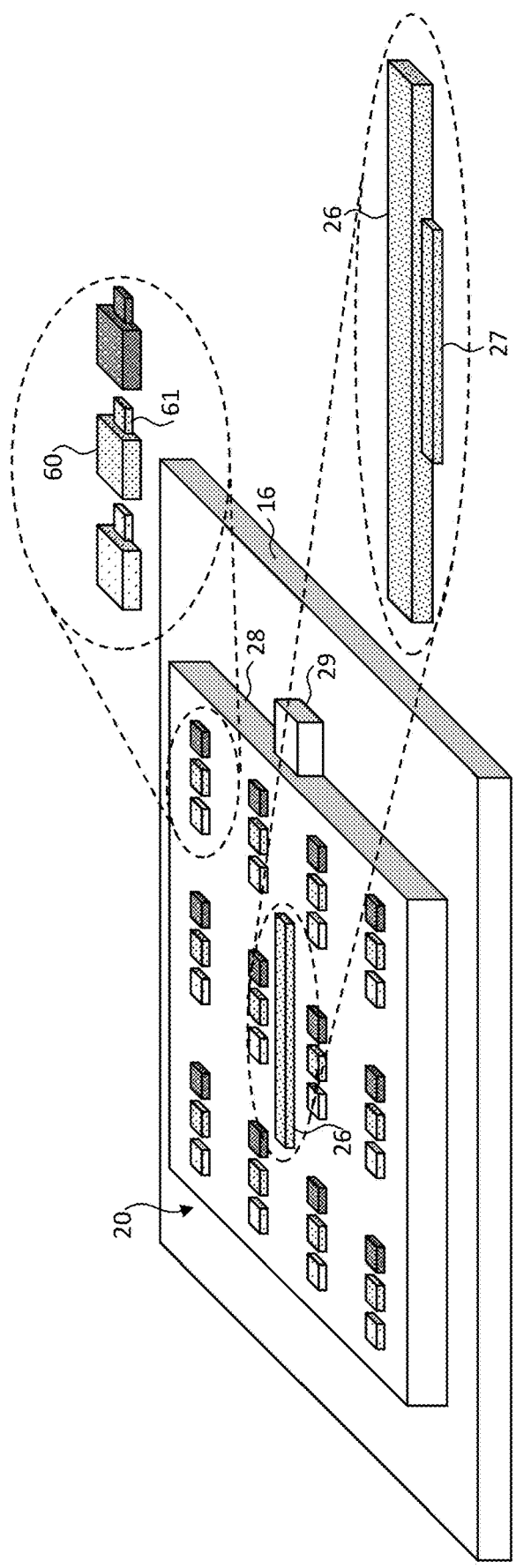
FIG. 10 is a perspective of components disposed on a pixel cluster substrate that is disposed on a display substrate according to illustrative embodiments of the present disclosure.

In some embodiments, micro-iLEDs 60 and pixel controller 62 are disposed directly on display substrate 16, as shown in FIG. 9. In some embodiments, and as illustrated in FIG. 10, micro-iLEDs 60 and cluster controller 26 are micro-transfer printed onto a pixel cluster substrate 28 that is distinct (e.g., separate, individual, or different) from display substrate 16 and separate, individual, and distinct from micro-iLEDs 60 and any micro-iLED substrates, display substrate 16, and cluster controller 26 substrate. Micro-iLEDs 60 and a cluster controller 26 of one or more pixel clusters 20 can be disposed on pixel cluster substrate 28. A single pixel cluster 20 can be disposed on a single pixel cluster substrate 28 or multiple pixel clusters 20 can be disposed on a single pixel cluster substrate 28. Pixel cluster substrates 28 can be disposed on display substrate 16, for example by micro-transfer printing or other assembly processes, such as surface-mount technology. Pixel clusters 20 on pixel cluster substrates 28 can be surface-mount devices or can be micro-assembled, for example by micro-transfer printing pixel cluster substrates 28 from a cluster source wafer to display substrate 16 so that pixel cluster substrates 28 can comprise a broken (e.g., fractured) or separated pixel cluster substrate tether 29 as a consequence of micro-transfer printing. Pixel cluster substrates 28 can comprise a same material as display substrate 16 or can be a different material.

Figure 11:
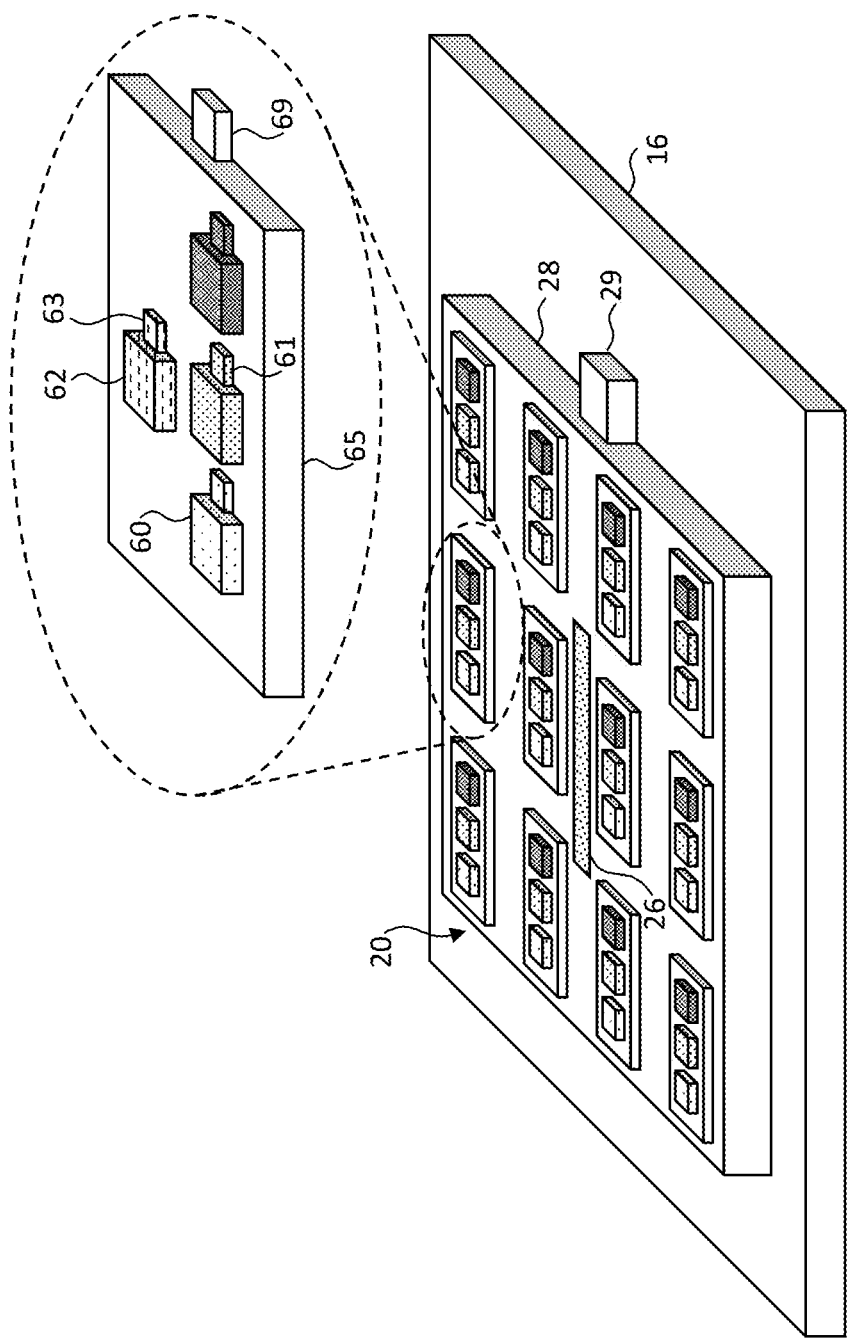
FIG. 11 is a perspective of micro-iLEDs disposed on pixel substrates that are disposed on a pixel cluster substrate disposed on a display substrate according to illustrative embodiments of the present disclosure.
Figure 12:
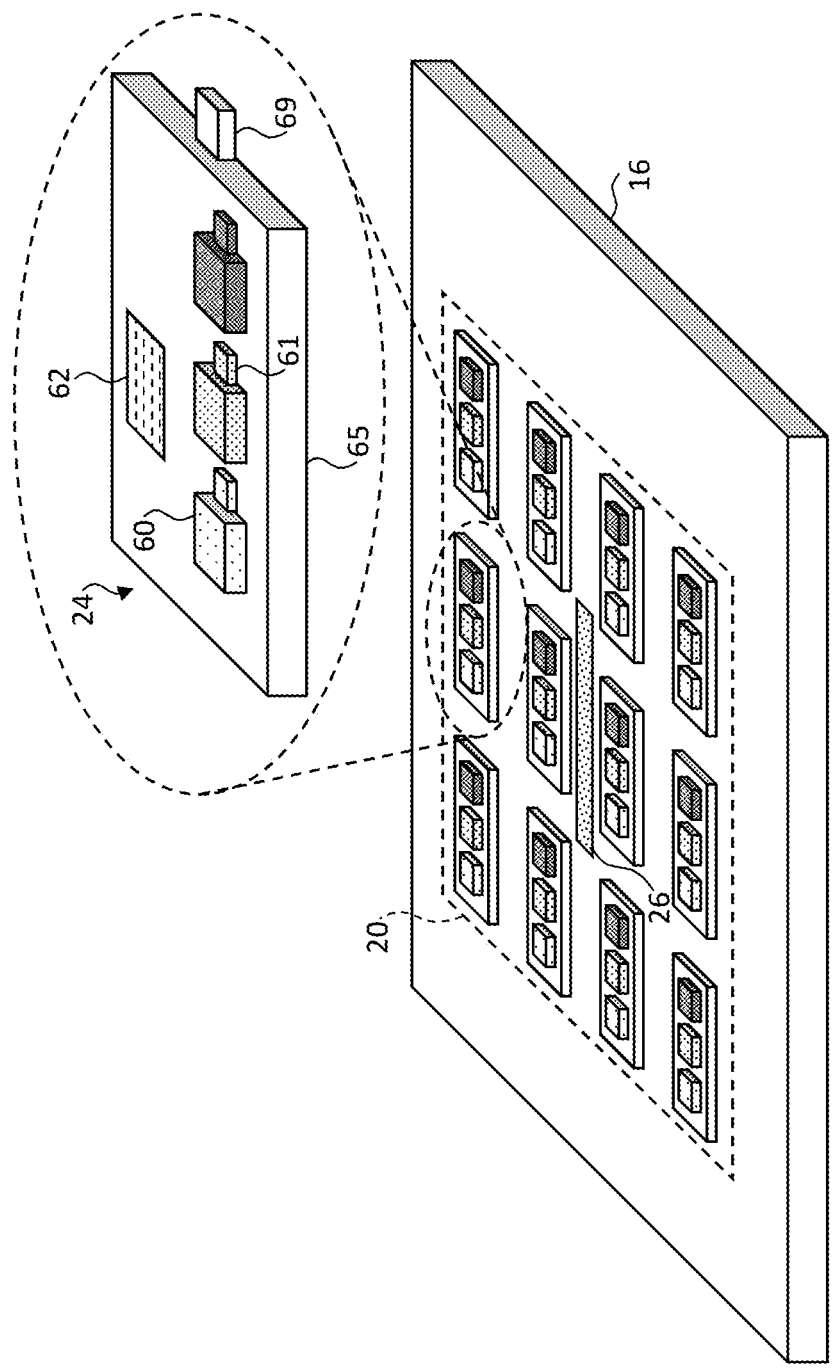
FIG. 12 is a perspective of micro-iLEDs disposed on a pixel cluster substrate that is disposed on a display substrate with a native pixel cluster controller according to illustrative embodiments of the present disclosure.

According to some embodiments and as shown in FIGS. 11-12, micro-iLEDs 60 and pixel controller 62 can be disposed on a pixel substrate 65 and micro-iLEDs 60 and pixel controller 62 can be micro-transfer printed from respective source wafers to pixel substrate 65 so that micro-iLEDs 60 each comprise a micro-iLED tether 61 and pixel controller 62 comprises a pixel controller tether 63. In some embodiments, pixel substrate 65 is a semiconductor substrate and pixel controller 62 is native to pixel substrate 65. In some embodiments, pixel substrate 65 is micro-transfer printed from a pixel source wafer to a pixel cluster substrate 28 and can comprise a pixel substrate tether 69. (A native pixel controller 62 is not illustrated in FIG. 11 but is shown in FIG. 12).

As illustrated in FIG. 11, cluster controller 26 in each pixel cluster 20 can be formed in or on, and therefore be native to, pixel cluster substrate 28 rather than micro-assembled on pixel cluster substrate 28, for example where pixel cluster substrate 28 is a semiconductor substrate such as a silicon substrate and by using photolithographic processes employed by the integrated circuit industry. Pixel cluster controller 26 can be an integrated circuit. As also illustrated in FIG. 11, pixels 10 with micro-iLEDs 60 can be micro-assembled on a pixel substrate 65 and pixel substrate 65 can be micro-assembled on pixel cluster substrate 28 so that pixel substrate 65 can comprise a broken (e.g., fractured) or separated pixel substrate tether 69 as a consequence of micro-assembling pixel substrate 65 from a pixel source wafer to pixel cluster substrate 28. Pixel substrates 65 can comprise material similar to or the same as pixel cluster substrate 28 or display substrate 16. One or more pixels 10 with pixel substrates 65 can be disposed directly on pixel cluster controller 26, where pixel cluster controller 26 is native to pixel cluster substrate 28, so that pixel cluster controller 26 can occupy a substantial amount of space on pixel cluster substrate 28 or pixel cluster controller 26 can be disposed between pixels 10 (as shown in FIG. 11) where pixel cluster controller 26 is non-native to pixel cluster substrate 28. Pixel cluster substrate 28 can be assembled on display substrate 16 or layers on display substrate 16, e.g., by using surface-mount techniques or micro-assembly using, for example, micro-transfer printing.

According to some embodiments and as shown in FIG. 12, pixel cluster controller 26 can be formed in or on and native to display substrate 16, for example where display substrate 16 is a semiconductor substrate, e.g., with photolithographic processing and materials, for example a silicon substrate in a micro-display. Micro-iLEDs 60 in pixels 10 can be assembled, for example by micro-transfer printing, directly on display substrate 16 or layers on display substrate 16, as shown in FIG. 9, or can be disposed on pixel substrates 65 and pixel substrates 65 can be assembled, for example by micro-transfer printing, onto display substrate 16 or layers disposed on display substrate 16, as shown in FIG. 12.

Embodiments of the present disclosure illustrated in FIGS. 10-12 use pixel cluster substrates 28 or pixel substrates 65, or both, to provide a compound micro-assembled structure. Such structures can be tested before assembly on display substrate 16. For example, pixel clusters 20 on pixel cluster substrates 28 as shown in FIGS. 10 and 11 can be tested before assembly on display substrate 16. Similarly, pixels 10 disposed on pixel substrates 65 can be tested before micro-assembly on pixel cluster substrates 28 or display substrate 16 as shown in FIGS. 11-12. By testing pixel clusters 20 or pixels 10 before assembly, any defective pixel cluster controllers 26 or pixels 10 can be discarded and not assembled on display substrate 16 or pixel cluster substrate 28, thereby improving display 90 yields and reducing costs. For example, either or both pixel cluster substrate 28 or pixel substrate 65 can comprise probe pads for automated testing and micro-assembly systems can be programmed to discard or not assemble any defective pixel clusters 20 or defective pixels 10.

Display substrates 16 of large-format displays can have signal-carrying wires (e.g., display row wires 12 and display column wires 14) that are lengthy (e.g., greater than one meter). Such long wires have a finite resistance and can experience parasitic capacitance and therefore signals carried on the wires can degrade significantly over the extent of display substrate 16. FIG. 1 illustrates display row wires 12 and display column wires 14 directly connected to each pixel cluster 20 and pixel cluster controller 26 in an array of pixel clusters 20 disposed over display substrate 16. According to some embodiments, electrically connecting display row wires 12 and display column wires 14 to fewer devices (e.g., a few cluster controllers 26 rather than many pixels 10) reduces the RC time constant of display row wires 12 and display column wires 14 and increases their data rate. Similarly, electrically connecting cluster row wires 22 and cluster column wires 24 to fewer pixels 10 that are closer together using pixel cluster controller 26 reduces the RC time constant of cluster row wires 22 and cluster column wires 24 and increases their data rate. Furthermore, signals on display row wires 12 and display column wires 14 can be regenerated over display substrate 16, for example in pixel cluster controllers 26 (or other, distinct signal regeneration circuits), to improve their integrity.

Display substrate 16 can be any useful substrate on which pixel cluster controllers 26 and an array of pixels 10 can be suitably disposed, for example glass, plastic, resin, fiberglass, semiconductor, ceramic, quartz, sapphire, or other substrates found in the display or integrated circuit industries. Display substrate 16 can be flexible or rigid and can be substantially flat and have relatively parallel opposing sides. Display row wires 12 and display column wires 14 can be wires (e.g., photolithographically defined electrical conductors such as metal lines) disposed on display substrate 16 that conduct electrical current from display row controllers 30 and display column controllers 40, respectively, to pixel cluster controllers 26. Similarly, cluster row wires 22 and cluster column wires 24 can be wires (e.g., photolithographically defined electrical conductors such as metal lines) disposed on display substrate 16 or pixel cluster controllers 26 that conduct electrical current from pixel cluster controllers 26 to pixels 10 and micro-iLEDs 60.

Generally, display substrate 16, pixel cluster substrate 28, and pixel substrate 65, if present, each have two opposing smooth sides suitable for material deposition, photolithographic processing, or micro-transfer printing of micro-iLEDs 60 or pixel cluster controllers 26 and can comprise similar materials. Display substrate 16 can have a size of a conventional display, for example a rectangle with a diagonal of a few centimeters to one or more meters. Display substrate 16 can include polymer, plastic, resin, polyimide, PEN, PET, metal, metal foil, glass, a semiconductor, or sapphire and have a transparency greater than or equal to 50%, 80%, 90%, or 95% for visible light. In some embodiments of the present disclosure, micro-iLEDs 60 emit light through display substrate 16. In some embodiments, micro-iLEDs 60 emit light in a direction opposite display substrate 16. Display substrate 16 can have a thickness from 5 microns to 20 mm (e.g., 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm). According to some embodiments of the present disclosure, display substrate 16 can include layers formed on an underlying structure or substrate, for example a rigid or flexible glass or plastic substrate.

In some embodiments, display substrate 16 can have a single, connected, contiguous display area 18 (e.g., a convex hull including pixels 10 that each have a pixel functional area such as the light-emitting area of micro-iLEDs 60 in pixels 10). The combined functional area of micro-iLEDs 60 can be less than or equal to one-quarter of display area 18. In some embodiments, the combined functional areas of micro-iLEDs 60 are less than or equal to one eighth, one tenth, one twentieth, one fiftieth, one hundredth, one five-hundredth, one thousandth, one two-thousandth, or one ten-thousandth of the contiguous system substrate area. Thus, remaining area over display substrate 16 is available for additional functional elements such as pixel cluster controllers 26 or pixel controllers 62.

Pixel cluster controller 26, pixel cluster row controller 26R, pixel cluster column controller 26C, or pixel controllers 62 can each be, for example, a bare, unpackaged integrated circuit die disposed between rows and columns of pixels 10 that provides control, timing (e.g., clocks) or data signals (e.g., column-data signals) through cluster row wires 22 and cluster column wires 24 to pixels 10 to enable pixels 10 to emit or control light in display 90.

The array of pixels 10 can be a completely regular array (e.g., as shown in FIG. 1) or can have pixel rows 10R or pixel columns 10C of pixels 10 that are offset from each other, so that pixel rows 10R or pixel columns 10C of pixels 10 are not disposed in a straight line and can, for example, form a zigzag line (not shown in the Figures) or, as another example, have non-uniform spacing(s).

Pixels 10 can be passive-matrix pixels 10, can be analog or digital, and can comprise one or more light-controlling or light-responsive elements, e.g., inorganic micro-light-emitting diodes 60. Pixels 10 can comprise inorganic micro-light-emitting diodes 60. Inorganic light-emitting diodes 60 can have a small area, for example having a length and a width each no greater than 20 microns, no greater than 50 microns, no greater than 100 microns, or no greater than 200 microns. Such small, light emitters 60 leave additional area on display substrate 16 for more or larger wires or additional functional elements such as pixel cluster controllers 26. When active, pixels 10 can be controlled at a constant current with timing signals such as temporal pulse-width modulation signals provided by pixel cluster controller 26 or pixel controller 62. Pixels 10 can comprise a red-light-emitting micro-iLED 60R that emits red light, a green-light-emitting micro-iLED 60G that emits green light, and a blue-light-emitting micro-iLED 60B that emits blue light (collectively micro-iLEDs 60) under the control of pixel cluster controller 26. In certain embodiments, light emitters 60 that emit light of other color(s) are included in pixel 10, such as a yellow micro-iLED 60. Pixels 10 can emit one color of light or white light (e.g., as in a black-and-white display) or multiple colors of light (e.g., red, green, and blue light as in a color display).

Micro-LEDs 60 can have a largest dimension of no greater than 100 microns. According to some embodiments of the present disclosure, pixels 10 comprise micro-iLEDs 60 that have a length and a width over display substrate 16 or pixel substrate 65 that is no greater than 100 microns (e.g., no greater than 50 microns, no greater than 20 microns, no greater than 15 microns, no greater than 12 microns, no greater than 10 microns, no greater than 8 microns, no greater than 5 microns, or no greater than 3 microns). Such relatively small, light emitters 60 disposed on a relatively large display substrate 16 (for example a laptop display, a monitor display, or a television display) take up relatively little area on display substrate 16 so that the fill factor of micro-iLEDs 60 on display substrate 16 (e.g., the aperture ratio or the ratio of the sum of the areas of micro-iLEDs 60 over display substrate 16 to the convex hull area of display substrate 16 that includes micro-iLEDs 60 or minimum rectangular area of the array of pixels 10 such as display area 18) is no greater than 30% (e.g., no greater than 20%, no greater than 10%, no greater than 5%, no greater than 1%, no greater than 0.5%, no greater than 0.1%, no greater than 0.05%, or no greater than 0.01%). For example, an 8K display (having a display array 18 bounding 8192 by 4096 display pixels 10) over a 2-meter diagonal 9:16 display with micro-iLEDs 60 having a 15-micron length and 8-micron width has a fill factor of much less than 1%. An 8K display having 40-micron by 40-micron pixels 10 can have a fill factor of about 3%. According to some embodiments of the present disclosure, the remaining area not occupied by light emitters 60 is used at least partly to provide pixel cluster controllers 26 between light emitters 60.

Existing prior-art flat-panel displays have a desirably large fill factor. For example, the lifetime of OLED displays is increased with a larger fill factor because such a larger fill factor reduces current density and improves organic material lifetimes. Similarly, liquid-crystal displays (LCDs) have a desirably large fill factor to reduce the necessary brightness of the backlight (because larger pixels transmit more light), improving the backlight lifetime and display power efficiency. Thus, prior displays cannot provide integrated cluster control because there is no space on their display substrates for additional or larger functional elements, such as pixel cluster controllers 26, in contrast to embodiments of the present disclosure.

In some embodiments, integrated circuits such as micro-iLEDs 60 or pixel cluster controllers 26 are made in or on a native semiconductor wafer and have a semiconductor substrate and are micro-transfer printed to a non-native substrate, such as pixel substrate 65, pixel cluster substrate 28, or display substrate 16. Any of pixel substrate 65, pixel cluster substrate 28, and display substrate 16 can include glass, resin, polymer, plastic, ceramic, or metal and can be non-elastomeric. Pixel cluster substrate 28 can be a semiconductor substrate and pixel cluster controller 26 can be formed in or on and native to pixel cluster substrate 28. Semiconductor materials (for example doped or undoped silicon, GaAs, or GaN) and processes for making small integrated circuits are well known in the integrated circuit arts. Likewise, backplanes such as display substrates 16 and means for interconnecting integrated circuit elements on the backplane are well known in the display and printed circuit board arts.

In a method according to some embodiments of the present disclosure, integrated circuits are disposed on the display substrate 16 by micro transfer printing. In some methods, integrated circuits (or portions thereof) or micro-iLEDs 60 are disposed on pixel substrate 65 to form a heterogeneous pixel 10 and pixel 10 is disposed on pixel cluster substrate 28 or display substrate 16 using compound micro-assembly structures and methods, for example as described in U.S. patent application Ser. No. 14/822,868 filed Aug. 10, 2015, entitled Compound Micro Assembly Strategies and Devices. However, since pixels 10 or pixel clusters 20 can be larger than the integrated circuits included therein, in some methods of the present disclosure, pixels 10 or pixel clusters 20 are disposed on display substrate 16 using pick-and-place methods found in the printed-circuit board industry, for example using vacuum grippers. Pixels 10 or pixel clusters 20 can be interconnected on display substrate 16 using photolithographic methods and materials or printed circuit board methods and materials.

In certain embodiments, display substrate 16 includes material, for example glass or plastic, different from a material in an integrated-circuit substrate, for example a semiconductor material such as silicon or GaN. Micro-iLEDs 60 can be formed separately on separate semiconductor substrates, assembled onto pixel cluster substrates 28 or pixel substrates 65 to form pixels 10 and then the assembled units are located on the surface of pixel cluster substrate 28 or display substrate 16. This arrangement has the advantage that the integrated circuits, pixel clusters 20, or pixels 10 can be separately tested on pixel cluster substrate 28 or pixel substrate 65 and pixel cluster 20 or pixel 10 modules accepted, repaired, or discarded before pixel clusters 20 or pixels 10 are located on display substrate 16, thus improving yields and reducing costs.

In some embodiments of the present disclosure, providing display 90, display substrate 16, pixel clusters 20, or pixels 10 can include forming conductive wires (e.g., display row wire 12, display column wire 14, cluster row wire 22, and cluster column wire 24) on display substrate 16, pixel cluster substrate 28, or pixel substrate 65 by using photolithographic and display-substrate processing techniques, for example photolithographic processes employing metal or metal oxide deposition using evaporation or sputtering, curable resin coatings (e.g. SU8), positive or negative photo-resist coating, radiation (e.g. ultraviolet radiation) exposure through a patterned mask, and etching methods to form patterned metal structures, vias, insulating layers, and electrical interconnections. Inkjet and screen-printing deposition processes and materials can be used to form patterned conductors or other electrical elements. The electrical interconnections, or wires, can be fine interconnections, for example having a width of less than fifty microns, less than twenty microns, less than ten microns, less than five microns, less than two microns, or less than one micron. Such fine interconnections are useful for interconnecting micro-integrated circuits, for example as bare dies with contact pads and used with pixel cluster substrate 28 and pixel substrate 65. Alternatively, wires can include one or more crude lithography interconnections having a width from 2 µm to 2 mm, wherein each crude lithography interconnection electrically interconnects circuits, device, or modules on display substrate 16. For example, electrical interconnections cluster row wire 22, and cluster column wire 24 can be formed with fine interconnections (e.g., relatively small high-resolution interconnections) while display row wire 12 and display column wire 14 are formed with crude interconnections (e.g., relatively large low-resolution interconnections).

In some embodiments, red, green, and blue micro-iLEDs 60 are micro transfer printed to pixel substrates 65, pixel cluster substrate 28, or display substrate 16 in one or more transfers and can comprise broken (e.g., fractured) or separated micro-iLED tethers 61 as a consequence of micro-transfer printing. For a discussion of micro-transfer printing techniques that can be used or adapted for use in methods disclosed herein, see U.S. Pat. Nos. 8,222,458, 7,622,367 and 8,506,867, each of which is hereby incorporated by reference in its entirety. The transferred light emitters 60 are then interconnected, for example with conductive wires and optionally including connection pads and other electrical connection structures.

In some embodiments of the present disclosure, an array of display pixels 10 (e.g., as in FIG. 1) can include at least 40,000, 62,500, 100,000, 500,000, one million, two million, three million, six million, eight million, or thirty-two million display pixels 10, for example for a quarter VGA, VGA, HD, 4K, or 8K display having various pixel densities (e.g., having at least 50, at least 75, at least 100, at least 150, at least 200, at least 300, or at least 400 pixels per inch (ppi)).

In some embodiments of the present disclosure, light emitters 60 in pixels 10 can be considered integrated circuits, since they are formed in a substrate, for example a wafer substrate, or layer using integrated-circuit processes. The substrate or layer need not necessarily be silicon, for example III-V semiconductor wafers or layers can be used to form light emitters 60 using integrated-circuit processes and are considered integrated circuits (or portions thereof) in the context of this disclosure.

In some embodiments of the present disclosure, light emitters 60 are inorganic micro-light-emitting diodes 60 (micro-iLEDs 60), for example having light-emissive areas of less than 10, 20, 50, or 100 square microns. In some embodiments, light emitters 60 have physical dimensions that are less than 100 µm, for example having at least one of a width from 2 to 50 µm (e.g., 2 to 5 µm, 5 to 10 µm, 10 to 20 µm, or 20 to 50 µm), a length from 2 to 50 µm (e.g., 2 to 5 µm, 5 to 10 µm, 10 to 20 µm, or 20 to 50 µm), and a height from 2 to 50 µm (e.g., 2 to 5 µm, 5 to 10 µm, 10 to 20 µm, or 20 to 50 µm). Light emitters 60 can have a size of, for example, one square micron to 500 square microns. Such micro-iLEDs 60 have the advantage of a small light-emissive area compared to their brightness as well as color purity providing highly saturated display colors and a substantially Lambertian emission providing a wide viewing angle. Such small light emitters 60 also provide additional space on display substrate 16 for additional functional elements or larger wires.

In some embodiments, micro-iLEDs 60 are formed in substrates or on supports separate from display substrate 16. For example, micro-iLEDs 60 can be made in a native compound semiconductor wafer. Similarly, row controllers 30, column controllers 40, display controllers 50, or pixel cluster controllers 26 can be separately formed in a semiconductor wafer such as a silicon wafer e.g., in CMOS circuits or mixed-signal circuits in an integrated circuit design using circuit design concepts known in the art. Micro-iLEDs 60, or pixel cluster controllers 26 are then removed from their respective source wafers and transferred, for example using micro-transfer printing, to display substrate 16, pixel cluster substrate 28, or pixel substrate 65. Such arrangements have the advantage of using a crystalline semiconductor substrate that provides higher-performance integrated circuit components than can be made in the amorphous or polysilicon semiconductor available in thin-film circuits on a large substrate such as display substrate 16. Such micro-transferred micro-iLEDs 60 or pixel cluster controllers 26 can comprise a broken (e.g., fractured) or separated micro-iLED tether 61 or pixel cluster controller tether 27 as a consequence of a micro-transfer printing process.

According to various embodiments, display 90 can include a variety of designs having a variety of resolutions, light emitter 60 sizes, and display substrate 16 areas.

By employing a multi-step transfer or assembly process, increased yields are achieved and thus reduced costs for displays 90 of the present disclosure. Additional details useful in understanding and performing aspects of the present disclosure are described in U.S. patent application Ser. No. 14/243,981, filed Jun. 18, 2015, entitled Micro Assembled Micro LED Displays and Lighting Elements, the disclosure of which is hereby incorporated by reference herein in its entirety.

As is understood by those skilled in the art, the terms "over", "under", "above", "below", "beneath", and "on" are relative terms and can be interchanged in reference to different orientations of the layers, elements, and substrates included in the present disclosure. For example, a first layer on a second layer, in some embodiments means a first layer directly on and in contact with a second layer. In other embodiments, a first layer on a second layer can include another layer there between.

As is also understood by those skilled in the art, the terms "column" and "row", "horizontal" and "vertical", and "x" and "y", "top" and "bottom", and "left" and "right" are arbitrary designations that can be interchanged (unless otherwise clear from context).

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as operability is maintained. Moreover, two or more steps or actions in some circumstances can be conducted simultaneously. The disclosure has been described in detail with particular express reference to certain embodiments thereof, but it will be understood that variations and modifications can be effected within the spirit and scope of the following claims.

PARTS LIST 10 pixel
10C pixel column/column of pixels/pixel cluster column
10R pixel row/row of pixels/pixel cluster row
12 row wire/display row wire
14 column wire/display column wire
16 display substrate
18 display area
20 pixel cluster/cluster
22 cluster row wire
24 cluster column wire
26 cluster controller/pixel cluster controller
26C cluster column controller
26R cluster row controller
27 cluster controller tether
28 pixel cluster substrate
29 pixel cluster substrate tether
30 row controller
32 driver
34 select circuit
36 display control circuit
38 display control signal
40 column controller
50 display controller
60 micro-iLED/light emitter
60A anode conductor
60B blue-light-emitting micro-iLED/blue micro-iLED
60C cathode conductor
60G green-light-emitting micro-iLED/green micro-iLED
60R red-light-emitting micro-iLED/red micro-iLED
61 micro-iLED tether
62 micro-iLED controller/pixel controller
63 micro-iLED controller tether/pixel controller tether
64 micro-iLED control circuit/pixel control circuit
65 pixel substrate
69 pixel substrate tether
70 signal circuit 71 signal circuit tether
72 signal-extraction circuit
80 touch controller
81 touch control circuit
82 touch-select signal
83 touch controller tether
84 touch sense control signal
85 touch sense response signal
86 first capacitor wire
88 second capacitor wire
90 display
100 provide display with clusters step
105 set N=0, M≠N step
110 drive pixel rows in each cluster to display image during frame period step
115 drive pixel row N step
116 sense row M step
120 drive pixel rows in each cluster to sense touches during blanking period step
130 M=number of rows? step
135 set M=0, N=N+1 step
140 N=number of display rows? Step
145 set N=N+1, M=M+1 step

What is claimed:

1. A display, comprising:
an array of pixels disposed in pixel rows and pixel columns on a display substrate, the array of pixels divided into mutually exclusive pixel subsets,
wherein each of the pixel subsets is comprised in a pixel cluster that comprises (i) a pixel cluster controller for controlling each pixel in the pixel cluster, the pixel cluster controller disposed on and non-native to the display substrate within or adjacent to the subset of pixels in the pixel cluster, and (ii) a touch controller for sensing a touch for each pixel in the pixel cluster, the touch controller disposed on and non-native to the display substrate within or adjacent to the subset of pixels in the pixel cluster,
wherein each of the pixels comprises a micro-inorganic-light-emitting-diode control circuit comprising (i) a micro-inorganic-light-emitting-diode (micro-iLED) comprising one or more inorganic material layers that emit light when electrical current passes through the one or more inorganic layers, an anode disposed in electrical contact with the one or more inorganic material layers, and a cathode disposed in electrical contact with the one or more inorganic material layers so that current passing from the anode to the cathode through the one or more inorganic material layers causes the micro-iLED to emit light; (ii) an anode conductor connected directly to the anode to provide electrical current to the micro-iLED; (iii) a cathode conductor connected directly to the cathode that receives electrical current from the micro-iLED, wherein the anode conductor or the cathode conductor is a signal conductor; and (iv) a signal circuit connected to the signal conductor, the signal circuit operable to provide or receive a control signal at a frequency of no less than one MHz on the signal conductor,
wherein, for each of the pixel rows, the anode conductor of the micro-inorganic-light-emitting-diode control circuit for each of the pixels in the pixel row are commonly connected and, for each of the pixel columns, the cathode conductor of the micro-inorganic-light-emitting-diode control circuit for each of the pixels in the pixel column are commonly connected, and
wherein, for each of the pixel clusters, the signal circuit of the micro-inorganic-light-emitting-diode control circuit of each of the pixels in the pixel cluster is a single common signal circuit for the pixel cluster.

2. The display of claim 1, wherein the micro-iLED of the micro-inorganic-light-emitting-diode control circuit of each of the pixels has a capacitance of no greater than 1 nanofarad.

3. The display of claim 1, wherein the signal circuit comprises a signal-extraction circuit operable to extract the control signal from the signal conductor.

4. The display of claim 1, wherein the signal circuit comprises a micro-iLED controller or a micro-iLED controller comprises the signal circuit.

5. The display of claim 1, wherein the signal circuit comprises a cluster controller or a cluster controller comprises the signal circuit.

6. The display of claim 1, wherein the signal circuit is operable to provide or receive a touch sense signal on the signal conductor at a frequency of no less than one MHz.

7. The display of claim 1, wherein the signal circuit is a capacitive touch controller.

8. The display of claim 1, wherein (i) the anode conductor, (ii) the cathode conductor, or (iii) both, are capacitive touch conductors.

9. The display of claim 1, wherein the micro-iLED comprises a separated or broken micro-iLED tether, the signal circuit comprises a separated or broken signal-circuit tether, or both.

10. The display of claim 1, wherein the anode conductor is a power plane or the cathode conductor is a ground plane.

11. The display of claim 1, wherein the pixel controller and the touch controller are disposed in separate integrated circuits.

12. The display of claim 1, wherein the pixel controller and the touch controller are disposed in a common integrated circuit.

13. The display of claim 1, wherein each row of pixels in the pixel cluster is separately connected from each row of pixels in any other pixel cluster.

14. The display of claim 1, wherein each column of pixels in the pixel cluster is separately connected from each column of pixels in any other pixel cluster.

15. The display of claim 1, wherein the pixel cluster controller for the pixel cluster provides passive-matrix control to each of the pixels in the pixel cluster.

16. The display of claim 1, wherein the pixel cluster controller for the pixel cluster provides active-matrix control to each of the pixels in the pixel cluster.

17. The display of claim 1, wherein the pixel cluster controller comprises a display control circuit operable to drive a first row wire or a first column wire with a display signal and a touch controller operable to drive a second row wire different from the first row wire or a second column wire different from the first column wire with a touch sense signal at a same time.

18. The display of claim 1, wherein the pixel cluster controller is operable to provide a display control signal to cluster rows of pixels or cluster columns of pixels during a frame period and is operable to sense the cluster row wires, the cluster column wires, or both during a blanking period to receive a touch sense signal.

19. The display of claim 1, wherein the pixel cluster comprises row wires and column wires and the pixel cluster controller comprises a display control circuit operable to separately and individually drive each of the row wires or each of the column wires sequentially with a display signal and the touch controller is operable to drive two or more of the cluster row wires or two or more of the cluster column wires in common with a common touch sense signal at a same time.

20. The display of claim 1, wherein the touch controller is operable to drive a touch sense control signal onto or to receive a touch sense response signal from two or more row wires in the pixel cluster, two or more column wires in the pixel cluster, or both at a same time.

* * * * *